US009525227B2

(12) United States Patent
Little et al.

(10) Patent No.: US 9,525,227 B2
(45) Date of Patent: *Dec. 20, 2016

(54) FLIPPABLE ELECTRICAL CONNECTOR

(71) Applicant: HON HAI PRECISION INDUSTRY CO., LTD., New Taipei (TW)

(72) Inventors: Terrance F. Little, Fullteron, CA (US); Chih-Pi Cheng, New Taipei (TW); Stephen Sedio, Valley Center, CA (US); Chun-Yi Chang, New Taipei (TW); Pei Tsao, Pomona, CA (US); Wei-Hao Su, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/454,737

(22) Filed: Aug. 8, 2014

(65) Prior Publication Data
US 2015/0044886 A1 Feb. 12, 2015

Related U.S. Application Data

(63) Continuation-in-part of application No. 14/337,180, filed on Jul. 21, 2012.
(Continued)

(51) Int. Cl.
*H01R 12/75* (2011.01)
*H01R 12/72* (2011.01)
(Continued)

(52) U.S. Cl.
CPC ............. *H01R 12/75* (2013.01); *H01R 12/724* (2013.01); *H01R 13/642* (2013.01); *H05K 1/117* (2013.01);
(Continued)

(58) Field of Classification Search
CPC .................. H01R 23/7073; H01R 23/7005
(Continued)

(56) References Cited

U.S. PATENT DOCUMENTS

| 5,073,130 A | 12/1991 | Nakamura |
| 6,666,696 B1 | 12/2003 | Wu |

(Continued)

FOREIGN PATENT DOCUMENTS

| CN | 2604799 | 2/2004 |
| CN | 201230066 Y | 4/2009 |

(Continued)

OTHER PUBLICATIONS

USB Newark WG/USB 3.0 Promoter Group, Universal Serial Bus Type-C Cable and Connector Specification, Revision 0.7 Working Draft, Jan. 2014, USA (conditionally published), pp. 13-14, 20-21,33, 38.

(Continued)

*Primary Examiner* — Phuongchi T Nguyen
(74) *Attorney, Agent, or Firm* — Wei Te Chung; Ming Chieh Chang

(57) ABSTRACT

A plug connector includes a mating tongue defining top and bottom surfaces thereon. Each surface is provided with a plurality of conductors in one row wherein the characters/ categories of the conductors on the top surface are sequentially arranged to be same with those on the bottom surface with a pair of power conductors in two notches at two lateral side edges. The corresponding receptacle connector mounted upon a printed circuit board, defines a receiving cavity to receive the mating tongue therein. Opposite top and bottom rows of contacts are respectively located by upper and bottom sides of the receiving cavity and categorized essentially in a same sequence with the conductors of the plug connector for respectively connecting to the corre-
(Continued)

sponding conductive pads, respectively. A pair of power contacts are located by two lateral sides of the receiving cavity to couple to the corresponding power conductor portions in the notches.

14 Claims, 36 Drawing Sheets

Related U.S. Application Data

(60) Provisional application No. 61/863,896, filed on Aug. 8, 2013, provisional application No. 61/866,037, filed on Aug. 14, 2013, provisional application No. 61/949,232, filed on Mar. 6, 2014, provisional application No. 61/867,584, filed on Aug. 19, 2013, provisional application No. 61/856,077, filed on Jul. 19, 2013, provisional application No. 61/857,687, filed on Jul. 23, 2013.

(51) Int. Cl.
 *H01R 13/642* (2006.01)
 *H05K 1/11* (2006.01)
 *H05K 1/18* (2006.01)

(52) U.S. Cl.
 CPC ..... *H05K 1/184* (2013.01); *H05K 2201/09063* (2013.01); *H05K 2201/10189* (2013.01)

(58) Field of Classification Search
 USPC .................. 439/660, 626, 374, 377, 79, 733
 See application file for complete search history.

(56) References Cited

U.S. PATENT DOCUMENTS

| | | | | |
|---|---|---|---|---|
| 6,755,689 | B2 * | 6/2004 | Zhang | H01R 12/716 439/357 |
| 6,890,220 | B2 | 5/2005 | Wang | |
| 7,114,981 | B1 | 10/2006 | Huang | |
| 7,445,469 | B2 | 11/2008 | Wu | |
| 7,758,379 | B2 | 7/2010 | Chen | |
| 7,909,648 | B2 | 3/2011 | Tai | |
| 8,087,944 | B2 | 1/2012 | Kumamoto et al. | |
| 8,251,746 | B2 | 8/2012 | Zhang | |
| 8,262,411 | B2 | 9/2012 | Kondo | |
| 8,439,576 | B2 | 5/2013 | Hsiao et al. | |
| 8,517,773 | B2 * | 8/2013 | Lee | H01R 12/722 439/660 |
| 8,562,378 | B2 | 10/2013 | Su | |
| 8,968,031 | B2 | 3/2015 | Simmel et al. | |
| 2010/0267261 | A1 | 10/2010 | Lin | |
| 2013/0095702 | A1 | 4/2013 | Golko et al. | |
| 2014/0024257 | A1 | 1/2014 | Castillo | |
| 2015/0056839 | A1 | 2/2015 | Zhang | |
| 2015/0072562 | A1 * | 3/2015 | Little | H01R 13/6658 439/607.55 |
| 2015/0162684 | A1 | 6/2015 | Amini et al. | |
| 2015/0171562 | A1 | 6/2015 | Gao et al. | |
| 2015/0171573 | A1 * | 6/2015 | Little | H01R 24/60 439/607.34 |
| 2015/0214673 | A1 | 7/2015 | Gao et al. | |
| 2015/0214674 | A1 | 7/2015 | Simmel et al. | |

FOREIGN PATENT DOCUMENTS

| | | |
|---|---|---|
| CN | 201282235 | 7/2009 |
| CN | 201392942 | 1/2010 |
| CN | 201523122 | 7/2010 |
| CN | 201623280 U | 11/2010 |
| CN | 201741935 | 2/2011 |
| CN | 201741937 U | 2/2011 |
| CN | 201868687 | 6/2011 |
| CN | 201887230 | 6/2011 |
| CN | 102544812 | 7/2012 |
| CN | 202423735 | 9/2012 |
| CN | 202737282 | 2/2013 |
| CN | 203242848 | 10/2013 |
| CN | 103579835 | 2/2014 |
| CN | 203481540 | 3/2014 |
| JP | 2008300119 | 12/2008 |
| JP | 5873173 | 10/2014 |
| TW | M288035 | 2/2006 |
| TW | M357077 | 5/2009 |
| TW | M414692 | 10/2011 |
| TW | M443957 | 12/2012 |
| TW | M454654 | 6/2013 |
| TW | I427870 | 2/2014 |
| WO | WO2013020359 | 2/2013 |

OTHER PUBLICATIONS

USB Newark WG/USB 3.0 Promoter Group, Universal Serial Bus Type-C Cable and Connector Specification, Revision 1.0, Aug. 11, 2014, USA, pp. 1, 19-10, 28-48, 51, 55, 58-63, 65-67,70,93, 96-99.
USB Newark WG/USB 3.0 Promoter Group, Universal Serial Bus Type-C Cable and Connector Specification, Revision 0.9 Working Draft, May 2014, USA (conditionally published), pp. 24-44, 47, 53-63, 84-86.

* cited by examiner

| Pin Out | | | | | | | | |
|---|---|---|---|---|---|---|---|---|
| 1 | 2 | 3 | 4 | 5 | 6 | 7 | 8 | 9 |
| TX | TX | GND | D+ | CC | D- | GND | RX | RX |
| | | | | | | | | |
| RX | RX | GND | D- | | D+ | GND | TX | TX |

FIG. 3

| Variation 1 | | | | | | | | | | | |
|---|---|---|---|---|---|---|---|---|---|---|---|
| 1 | 2 | 3 | 4 | 5 | 6 | 7 | 8 | 9 | 10 | 11 | 12 |
| GND | RX | RX | GND | GND | TX | TX | GND | D+ | D+ | PWR | CC |
| CC | PWR | D+ | D+ | GND | TX | TX | GND | GND | RX | RX | GND |

| Variation 2 | | | | | | | | | | | |
|---|---|---|---|---|---|---|---|---|---|---|---|
| 1 | 2 | 3 | 4 | 5 | 6 | 7 | 8 | 9 | 10 | 11 | 12 |
| GND | RX | RX | GND | CC | GND | TX | TX | GND | D+ | D+ | PWR |
| PWR | D+ | D+ | GND | TX | TX | GND |  | GND | RX | RX | GND |

| Variation 3 | | | | | | | | | | | |
|---|---|---|---|---|---|---|---|---|---|---|---|
| 1 | 2 | 3 | 4 | 5 | 6 | 7 | 8 | 9 | 10 | 11 | 12 |
| GND | TX | TX | GND | D+ | D- | PWR | CC | GND | RX | RX | GND |
| GND | RX | RX | GND |  | PWR | D- | D+ | GND | TX | TX | GND |

| Variation 4 | | | | | | | | | | |
|---|---|---|---|---|---|---|---|---|---|---|
| 1 | 2 | 3 | 4 | 5 | 6 | 7 | 8 | 9 | 10 | 11 |
| GND | TX | TX | PWR | D+ | CC | D- | GND | RX | RX | PWR |
| PWR | RX | RX | GND | D- | CC | D+ | PWR | TX | TX | GND |

| Variation 5 | | | | | | | | | | |
|---|---|---|---|---|---|---|---|---|---|---|
| 1 | 2 | 3 | 4 | 5 | 6 | 7 | 8 | 9 | 10 | 11 |
| GND | RX | RX | GND | D+ | CC | D- | PWR | TX | TX | GND |
| GND | TX | TX | PWR | D- |  | D+ | GND | RX | RX | GND |

| Variation 6 | | | | | | | | | | |
|---|---|---|---|---|---|---|---|---|---|---|
| 1 | 2 | 3 | 4 | 5 | 6 | 7 | 8 | 9 | 10 | 11 |
| GND | RX | RX | GND | D+ | D- | PWR | TX | TX | GND | CC |
|  | GND | TX | TX | PWR | D- | D+ | GND | RX | RX | GND |

FIG. 4

Variation 7

| GND | RX1+ | RX1− | GND | D+ | D− | CC | TX1− | TX1+ | GND | PWR |
|---|---|---|---|---|---|---|---|---|---|---|
| PWR | GND | TX2+ | TX2− |  | D− | D+ | GND | RX2− | RX2+ | GND |

Variation 8

| GND | RX1+ | RX1− | GND | PWR | D+ | D− | CC | GND | TX1− | TX1+ |
|---|---|---|---|---|---|---|---|---|---|---|
| TX1+ | TX1− | GND | CC | D− | D+ | PWR | GND | RX1− | RX1+ | GND |

Variation 9

| GND | RX1+ | RX1− | GND | PWR | D+ | D− | CC | TX1− | TX1+ | GND |
|---|---|---|---|---|---|---|---|---|---|---|
| GND | TX1+ | TX1− | CC | D− | D+ | PWR | GND | RX1− | RX1+ | GND |

FIG. 5

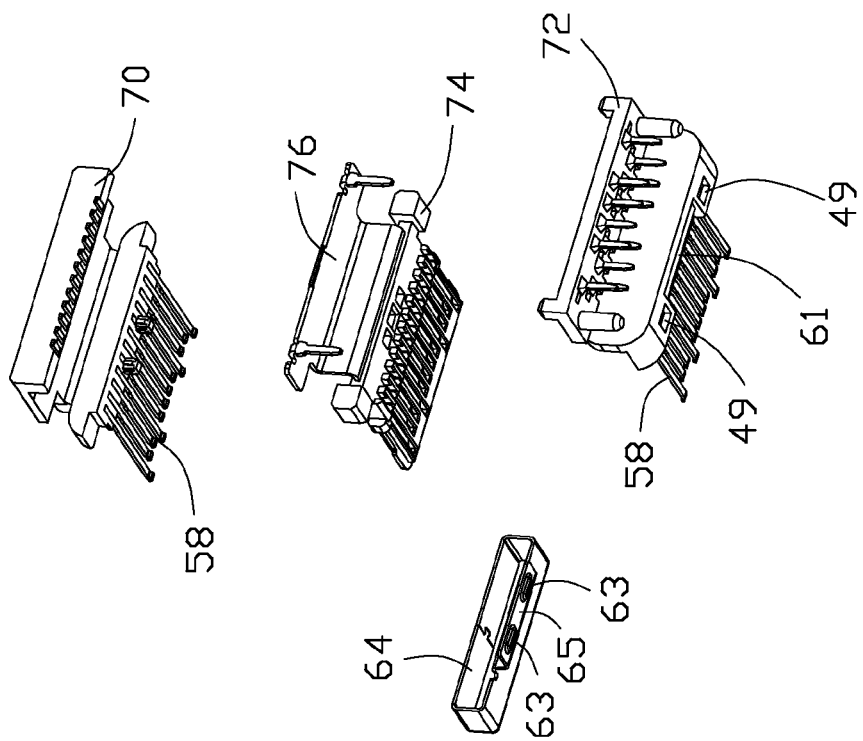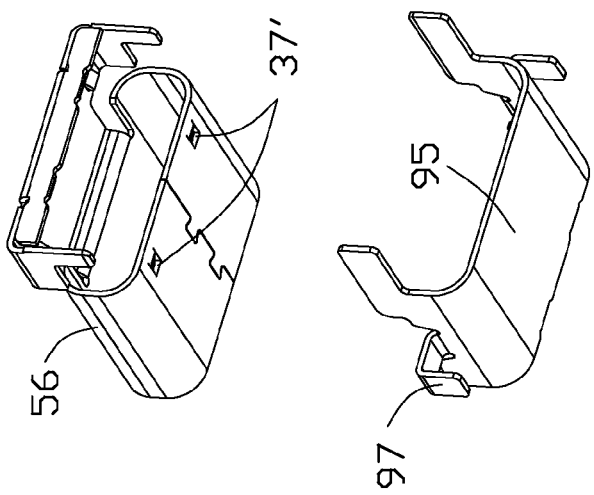
FIG. 22(B)

FLIPPABLE ELECTRICAL CONNECTOR

CROSS REFERENCE TO RELATED APPLICATIONS

This application is a continuation-in-part of the copending application Ser. No. 14/337,180 filed on Jul. 21, 2014 which claims its own priorities of the corresponding provisional applications, and the instant application further claims the benefit of, and priority to, U.S. Provisional Patent Application No. 61/863,896, filed Aug. 8, 2013, No. 61/866,037, filed Aug. 14, 2013, No. 61/867,584, filed Aug. 19, 2013, and No. 61/949,232 filed Mar. 6, 2014, the contents of which are incorporated entirely herein by reference.

BACKGROUND OF THE INVENTION

1. Field of the Invention

The present invention relates to an electrical connector, and more particularly to a flappable plug connector used with a receptacle connector.

2. Description of Related Art

US Patent Publication No. 20130095702A1 discloses a dual orientation plug connector, which has a connector tab with first and second major opposing sides and a plurality of electrical contacts carried by the connector tab. The plurality of contacts may include a first set of external contacts formed at the first major side and a second set of external contacts formed at the second major side. The first plurality of contacts may be symmetrically spaced with the second plurality of contacts and the connector tab may be shaped to have 180 degree symmetry so that it can be inserted and operatively coupled to a corresponding receptacle connector in either of two insertion orientations.

A receptacle connector corresponds to the plug connector. A sensing circuit in the receptacle or the electronic device in which the receptacle connector is housed can detect the orientation of the contacts and switch internal connections to the contacts in the connector jack as appropriate. When the contacts are more, the sensing circuit is more complicated, which will waste software switches or hardware switches.

Hence, a new and simple electrical connector is desired.

SUMMARY OF THE INVENTION

Accordingly, the object of the present invention is to provide a flappable plug connector.

In order to achieve the above-mentioned object, a plug connector comprises a mating tongue defining opposite top and bottom surfaces thereon. Each surface is provided with a plurality of conductors or conductive pads in one row wherein the characters/categories of the conductors on the top surface are sequentially arranged to be either same with those on the bottom surface or with one conductor appearing on the top surface while missing on the bottom surface with a vacant space. The corresponding receptacle connector mounted upon a printed circuit board, defines a receiving cavity to receive the mating tongue therein. Opposite top and bottom rows of contacts are respectively located by upper and bottom sides of the receiving cavity and categorized in a same sequence with the conductors of the plug connector for respectively connecting to the corresponding conductive pads, respectively, when the mating tongue of the plug connector is inserted into the receiving cavity. Under this arrangement, the plug connector is flappable with regard to the receptacle connector in operation without necessity of orientation consideration. A pair of power contacts are optionally located respectively on two opposite interior side surfaces beside the receiving cavity to mechanically and electrically connected and engaged with a pair of corresponding power conductor portions located in two opposite notches of two opposite lateral sides of the mating tongue.

Other objects, advantages and novel features of the invention will become more apparent from the following detailed description when taken in conjunction with the accompanying drawings.

BRIEF DESCRIPTION OF THE DRAWINGS

FIG. 3 is a table showing the pin assignments of the contacts of the receptacle connector of FIG. 2.

FIG. 4 is a table showing the pin assignments of the conductors on the top surface and the bottom surface of the mating tongue of the plug or of the contacts in the upper and lower row of the receptacle in another embodiment.

FIG. 5 is a table showing the pin assignments of the conductors on the top surface and the bottom surface of the mating tongue of the plug or of the contacts in the upper and lower row of the receptacle in another embodiment.

FIG. 22(B) is a rear partially exploded perspective view of the receptacle connector of FIG. 15 wherein the housing and the contacts are pre-assembled together.

FIG. 9(A) is a cross-sectional view of the receptacle connector to show the extending plate of the collar.

DETAILED DESCRIPTION OF THE PREFERRED EMBODIMENT

Figure 1:
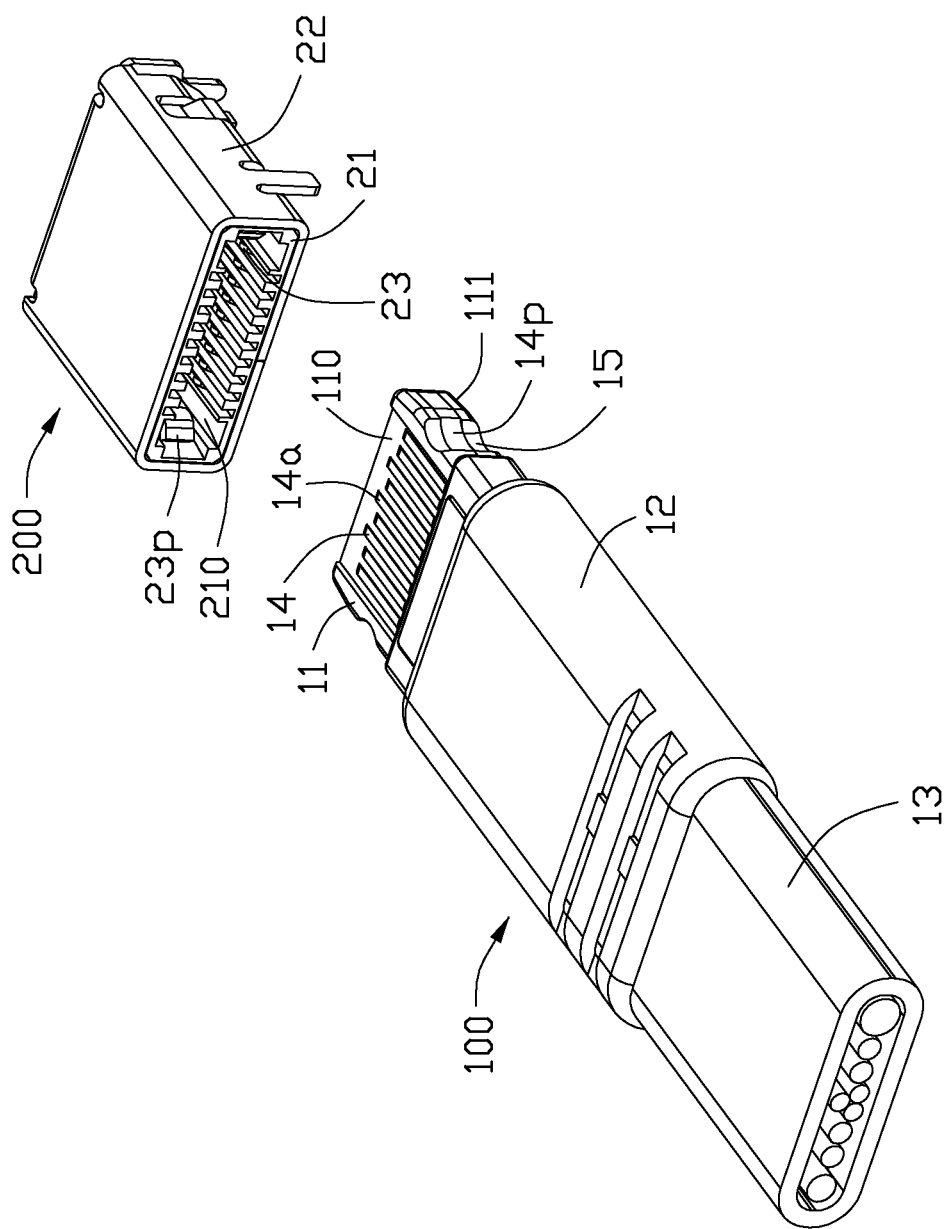
FIG. 1 is a perspective view of a plug connector and a receptacle connector according to a first embodiment of the present invention.
Figure 2:
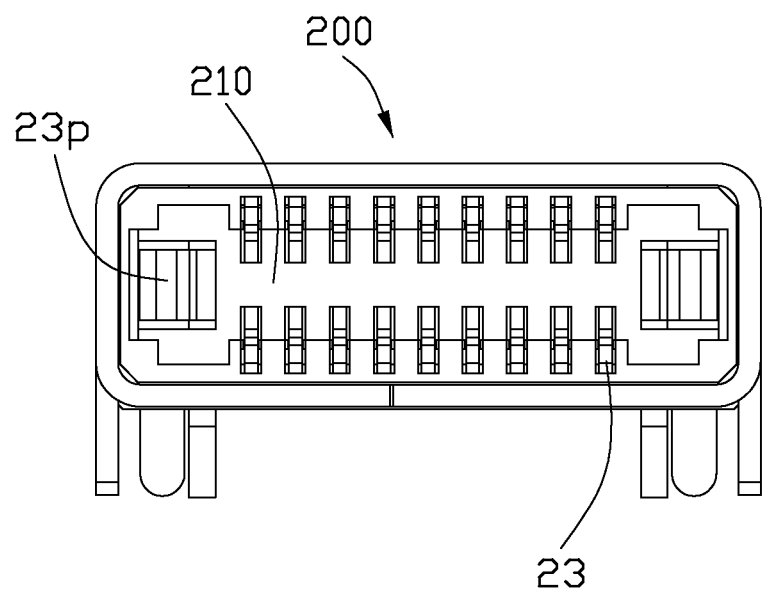
FIG. 2 is a front elevational view of the receptacle connector of FIG. 1.

Reference will now be made in detail to the preferred embodiment of the present invention Referring to FIGS. 1-2, the instant invention discloses an assembled of a plug connector 100 and a receptacle connector 200. The plug connector 100 includes a mating tongue 11, defining opposite top surface 110 and bottom surface 111. An overmolded cover 12 encloses a rear part of the mating tongue 11, and a cable 13 extends rearwardly from a rear end of the overmolded cover 12. A plurality of conductors 14 are formed on the top surface 110 and on the bottom surface 111 and categorized with differential-pair pads, grounding pads, power(Vbus) pads, and signal pads in sequence essentially corresponding to what is shown FIG. 3.

The receptacle connector 200 includes an insulative housing 21 enclosed in a metallic shell 22. The housing defines a receiving cavity 210 for receiving the mating tongue 11. A plurality of contacts 23 are disposed in the housing 21 and arranged in opposite top row and bottom row by two sides of the receiving cavity 210 in the vertical direction. Notably, the characters/categories of the contacts 23 sequentially are shown in FIG. 3. Understandably, the difference between the arrangement of the conductors 14 and that of the contacts 23 is that in this embodiment the plug connector 100 lacks one functional conductive 14, i.e., the center contact in the lower row under the so-called CC contact 14 while in the receptacle connector 200 the corresponding so-called CC conductors are formed on both the upper row and the bottom row so as to perform the so-called flappable mating. The instant application further includes a pair of power contacts 23p in opposite interior side surfaces of the housing 21 with bulged contours around tip regions for coupling to the recessed regions of the corresponding power conductor portions 14p in the notches 15 of the mating tongue 11 for not only electrical connection but also the mechanical retention.

FIGS. 4-5 show other variations of the pin assignment for either the contacts 23 of the receptacle connector 200 or the conductors 14 of the plug connector 100.

Figure 6:
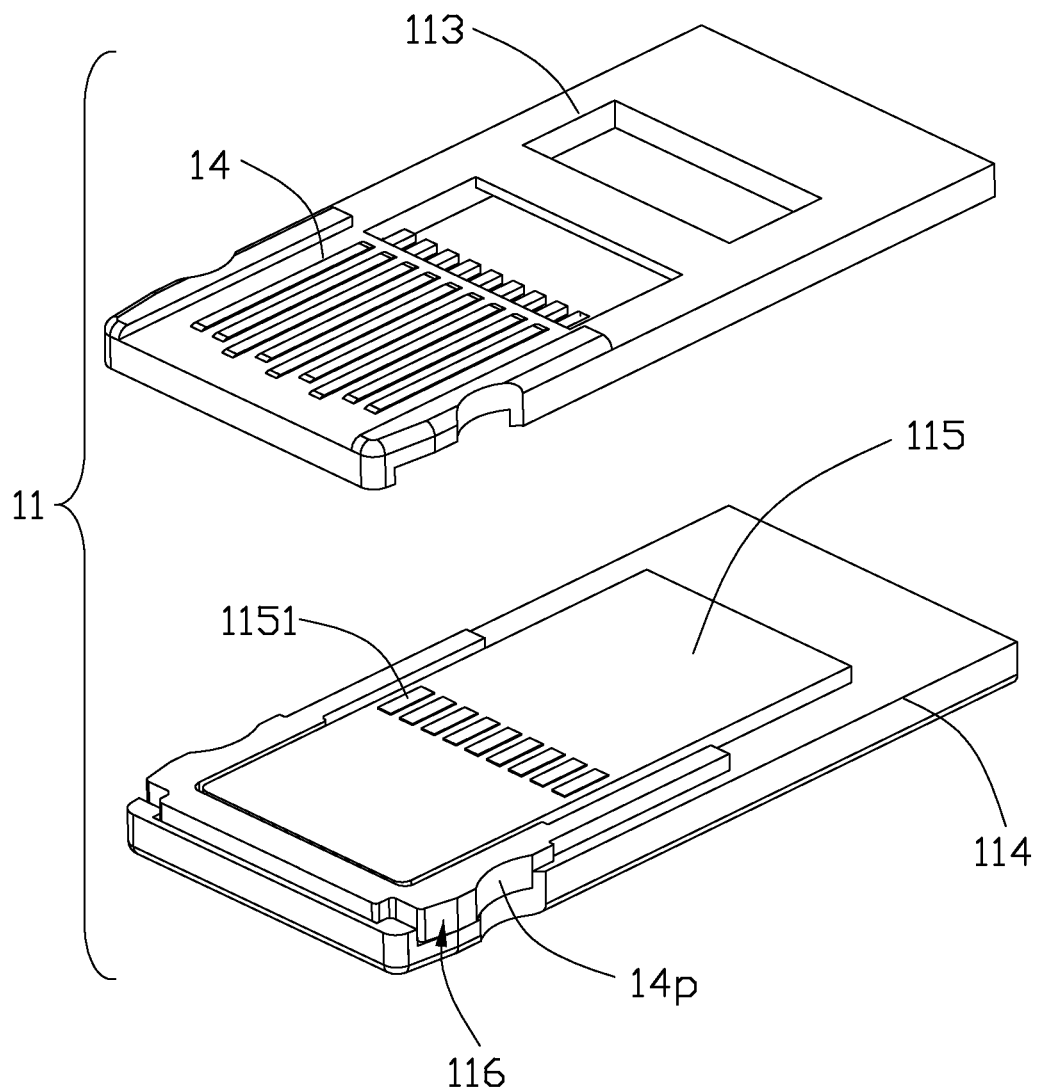
FIG. 6 is a perspective view of a board of the plug connector of FIG. 1 with the mating tongue thereof showing the conductors thereon.

FIG. 6 show the mating tongue 11 of the plug connector 100 includes a top insulator 113 and a bottom insulator 114 to sandwich an internal printed circuit board 115 therebetween. A U-shaped reinforcement structure 116 is located adjacent to and intimately surrounds the printed circuit board 115 with opposite inwardly recessed lateral portions exposed within the corresponding notches to function as the power conductor portions 14p. The conductors 14 are embedded within the top/bottom insulator 113/114 via an insert molding process with tails soldered to the corresponding pads 1151.

Figure 7:
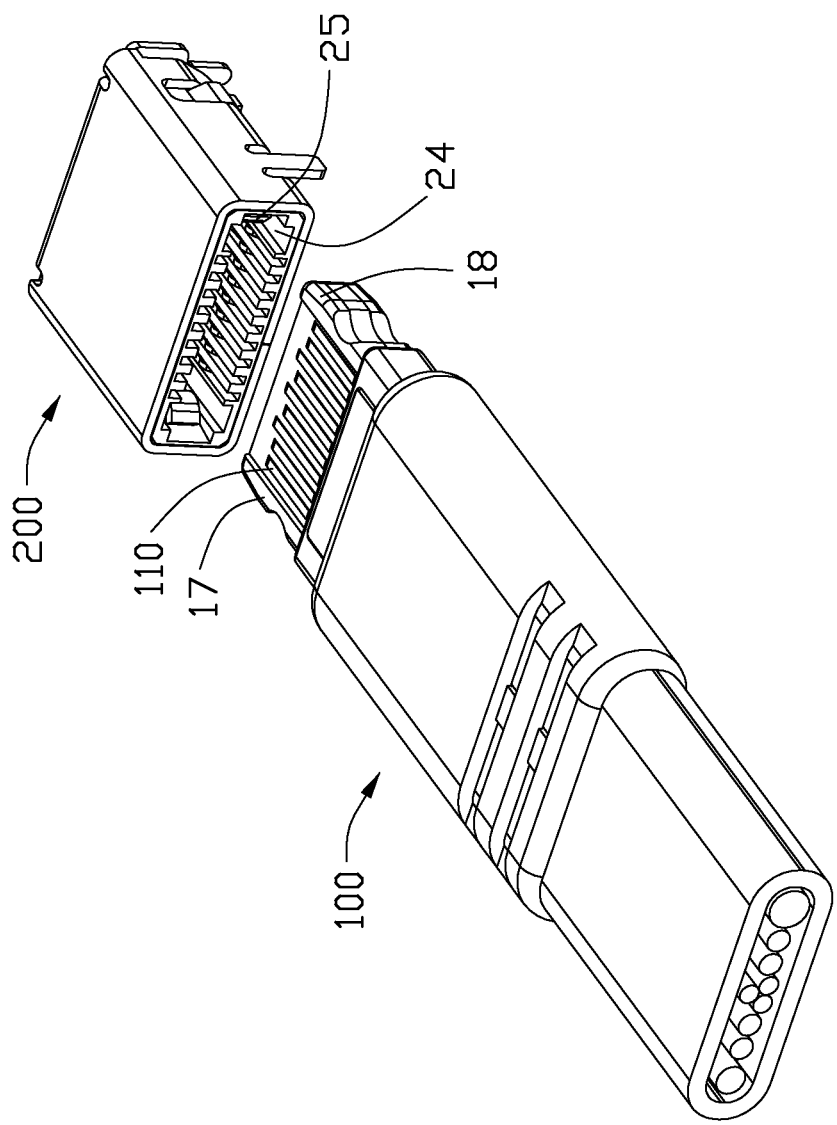
FIG. 7. is similar to FIG. 1.
Figure 8:
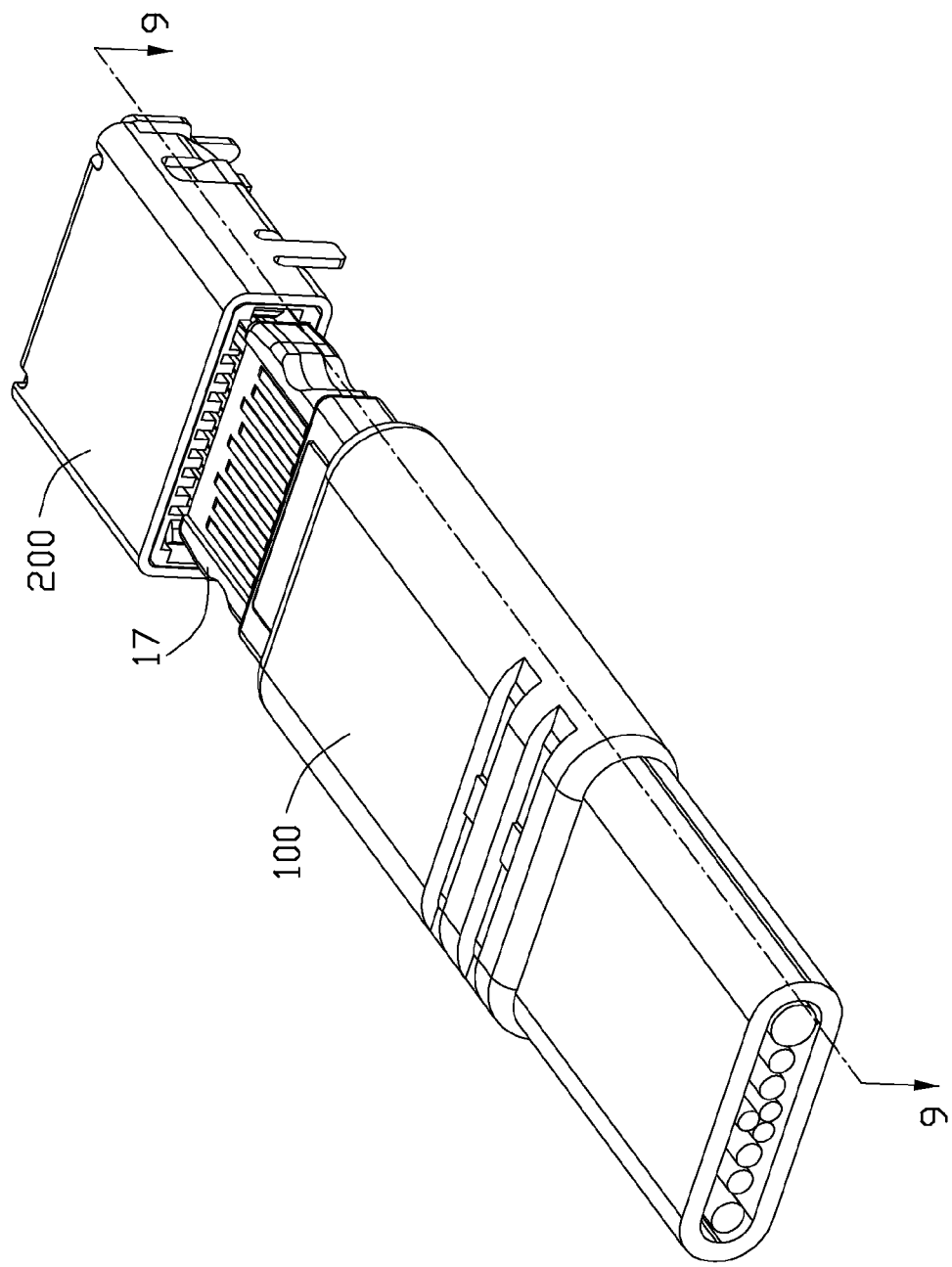
FIG. 8 is a perspective view of the plug connector and the receptacle connector of FIG. 7 mated with each other.
Figure 9:
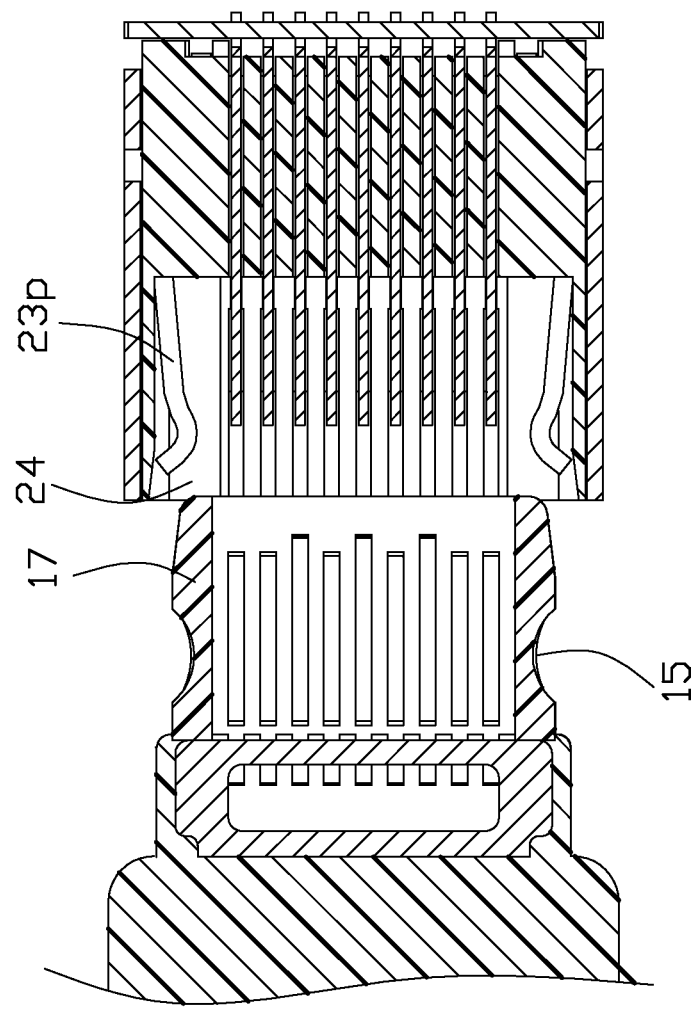
FIG. 9 is a cross sectional view of the plug connector and the receptacle connector of FIG. 8 taken along lines 9-9.

Referring to FIGS. 7-9, the mating tongue 11 of the plug connector 100 with the plurality of conductors 14 on the opposite top and bottom surfaces and the pair of power conductor portions 14p on two opposite side edges, defines a pair of raised ribs 17 with a height Y are formed on two opposite side regions of each of the top surface 110 and bottom surface under condition that a vertical dimension between the opposite top and bottom surfaces on most areas without thereof the pair of ribs 17 is X while is X+Y on the area with the ribs 17. The mating tongue 11 further defines a pair of wedge structures 18 around front ends of the two lateral side edges in a top view.

The insulative housing 21 of the receptacle connector 200 with a plurality of contacts 23 are disposed on the opposite upper and bottom sides of the housing 21 for mating with the conductors 14 and a pair of power contacts 23p having bugled contours around the corresponding tip regions are located on two opposite lateral sides for mating with the recessed regions of the power conductor portions 14p in the notches 15, defines a pair of slots 40 are formed in each of the upper side and the bottom side of the housing 21 for snugly receiving the corresponding pair of ribs 17 during mating. The power contact sections 23p in a spring cantilever pattern are located in side slots 25 of the housing 21

Figure 29:
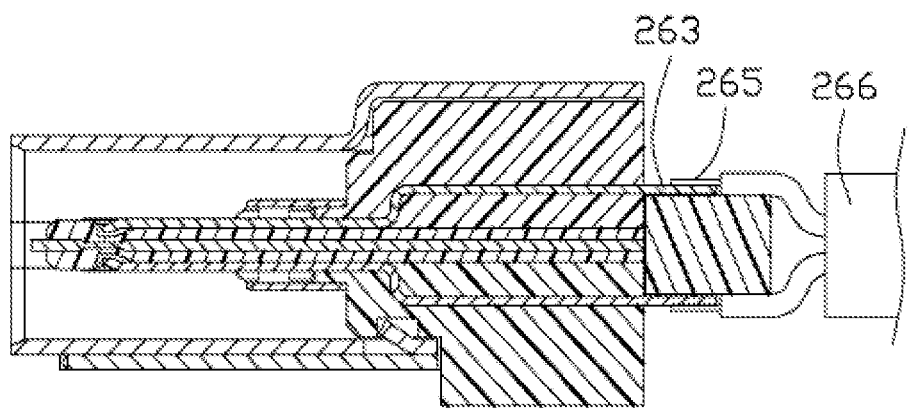
FIG. 29 is a cross-sectional view of the receptable connector of FIG. 15 to show the tails of the contacts are connected to the corresponding wires of a cable according to another embodiment of the invention.

Referring to FIG. 29, in another embodiment the invention, the tails 263 of the contact are connected to the corresponding wires 265 of the cable 266.

Figure 10:
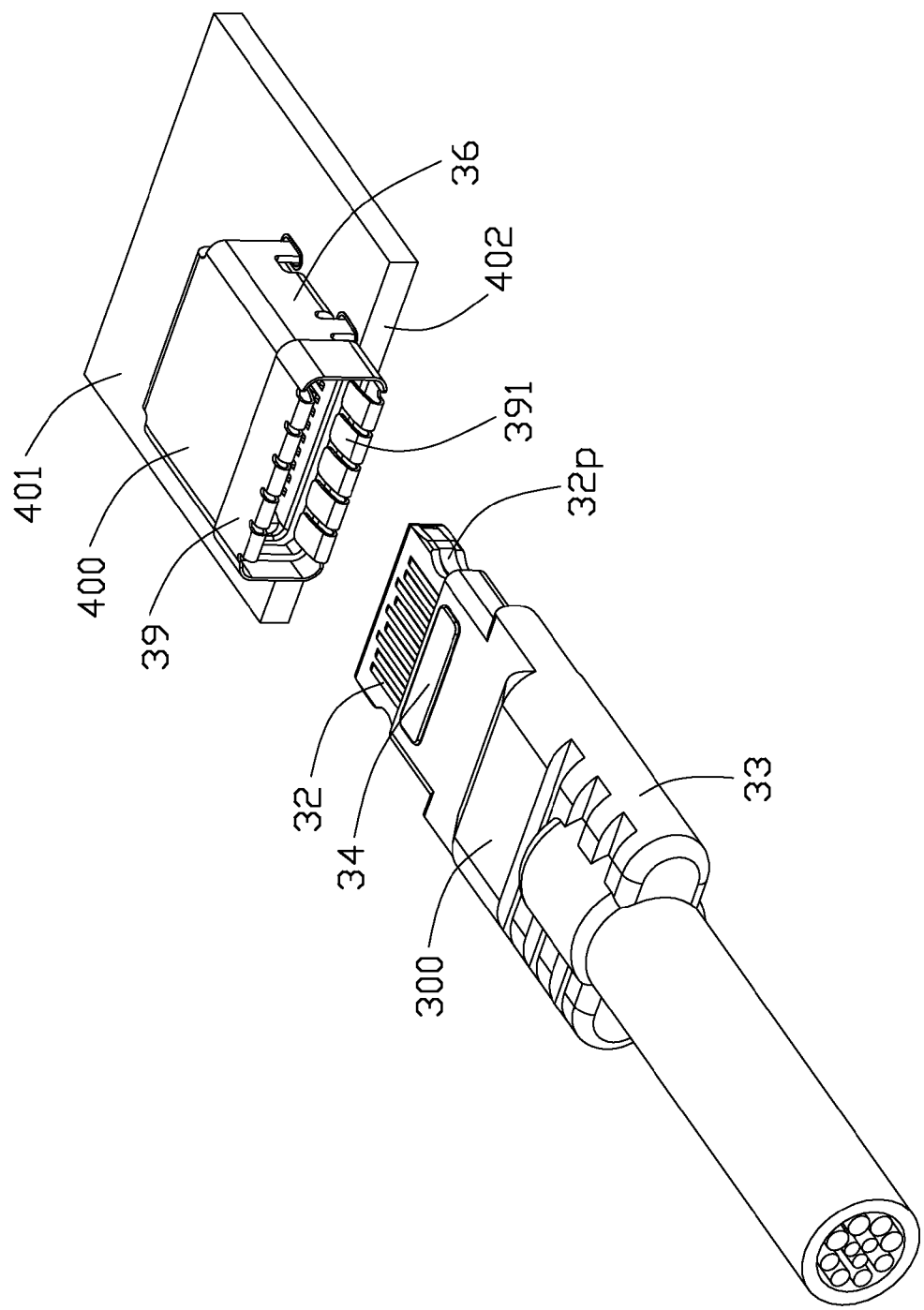
FIG. 10 is a perspective view of a plug connector and a receptacle connector mounted upon a printed circuit board according to a second embodiment of the present invention.
Figure 11:
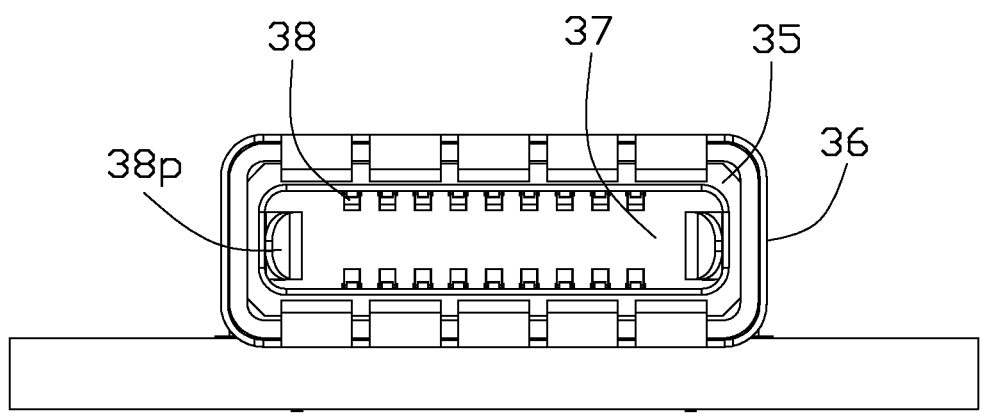
FIG. 11 is a front elevational view of the receptacle connector and the printed circuit board of FIG. 10.
Figure 12:
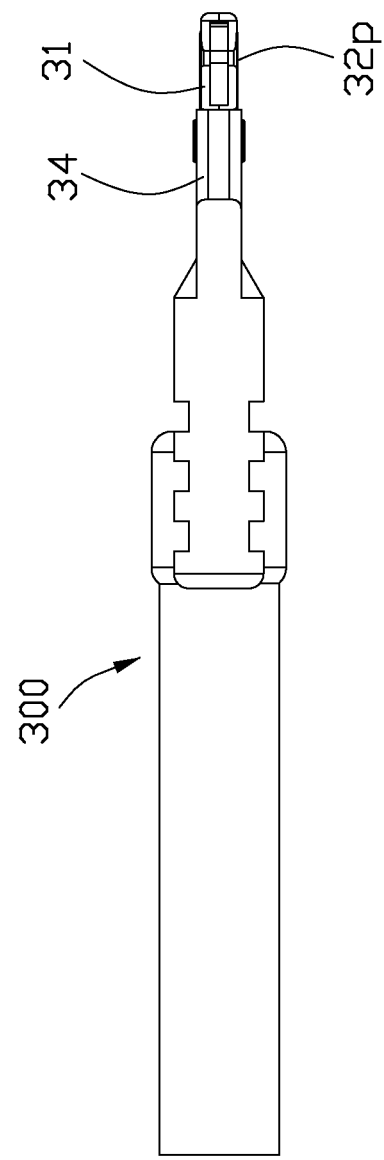
FIG. 12 is a side view of the plug connector of FIG. 10.

Referring to FIGS. 10-12, the instant invention discloses an assembled of a receptacle connector 400 mounted upon a printed circuit board 401, and a plug connector 300 adapted to be mated with the receptacle connector 400. The receptacle connector 400 includes an insulative housing 35 enclosed in a metallic shell 36 and defining a receiving cavity 37 with upper and lower rows of contacts 38 by two sides of the receiving cavity 37 in the vertical direction. A pair of power contacts 38p are disposed in the housing and by two lateral sides of the receiving cavity 37. A metallic bracelet like gasket 39 is attached to a front region of the shell 36 and defines a plurality of spring fingers 391 backwardly extending into the receiving cavity 37 around a front opening of said receiving cavity 37. The gasket 39 is essentially located in front of the front edge 402 of the printed circuit board 401.

The plug connector 300 defines an exposed mating tongue 31 with conductors 32 on two opposite surfaces of the mating tongue 31. An overmolding 33 is located behind the mating tongue 32 with a grounding bar 34 exposed around a front region of the overmolding 33 and right behind the mating tongue 31 for engagement with the spring fingers 451 of the gasket 45 during mating. A cable extends rearwardly behind the overmolding 33. A pair of recessed power conductor portions 32p are exposed in the corresponding notches in two lateral sides of the mating tongue 31. In this embodiment as shown in FIG. 13, the mating tongue 31 is made with two insulators sandwiching an internal printed circuit board 313 wherein the conductors 32 are insert molded in the insulator 311, 312 with the pair of power conductor portions 32p are exposed in the corresponding notches.

Figure 13:
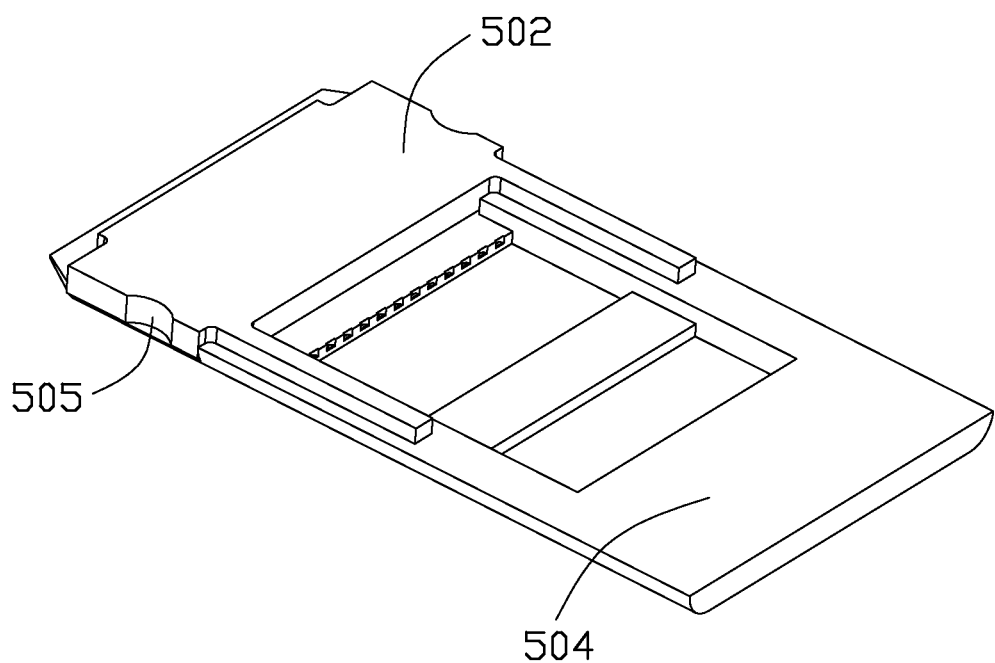
FIG. 13 is a perspective view of a portion of the plug connector of another embodiment to show the contour of the U-shaped metallic plate therein.
Figure 14:
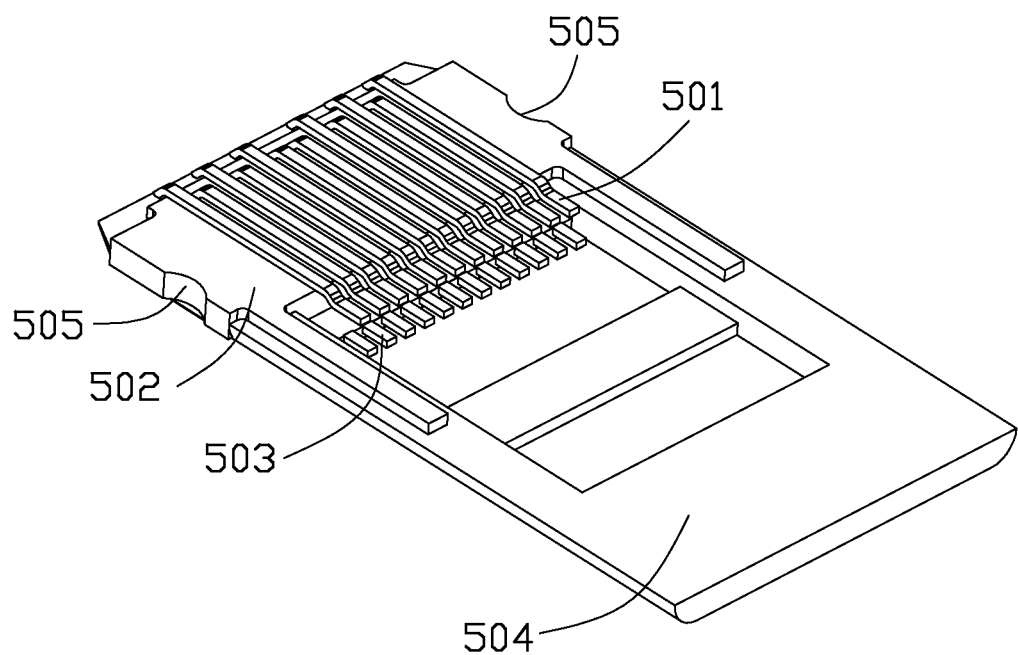
FIG. 14 is a perspective view of a portion of the plug connector of FIG. 13 with the upper conductors and the lower conductors therein
Figure 15:
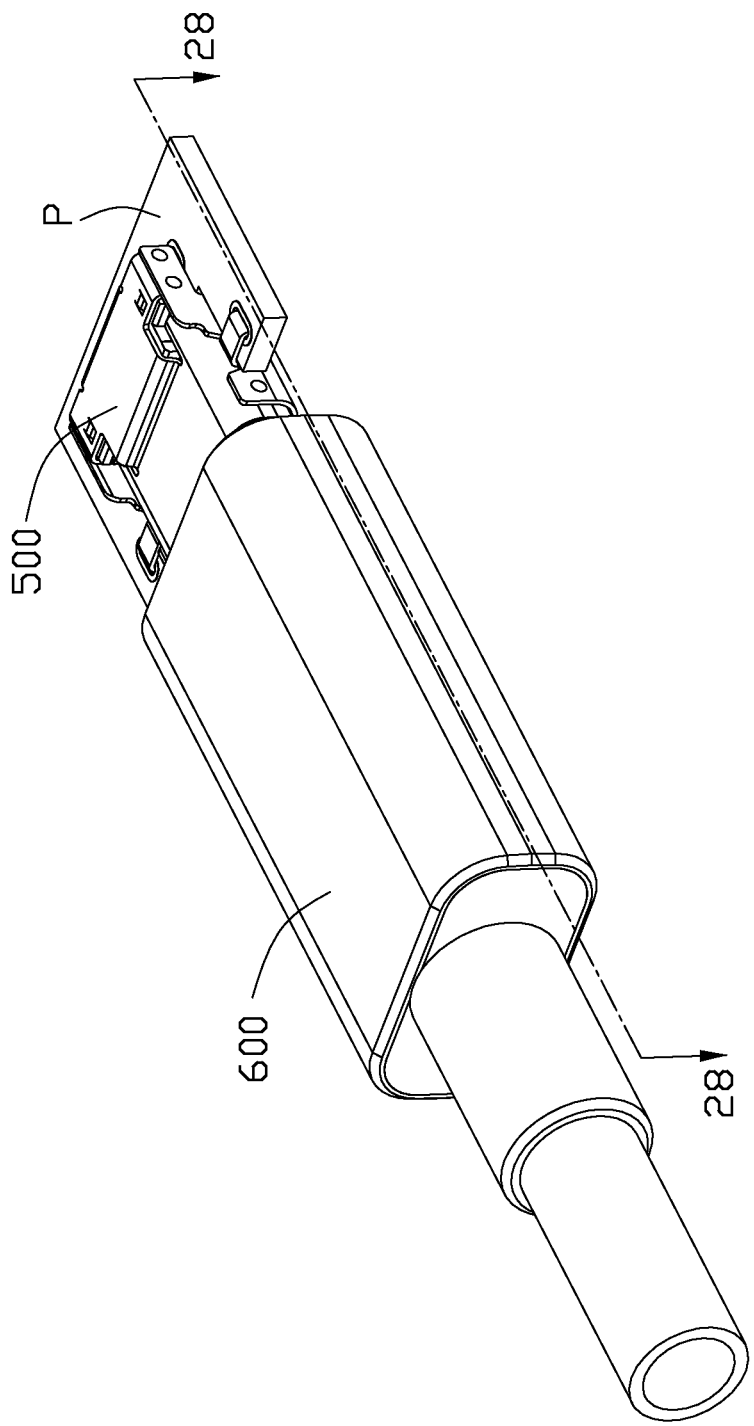
FIG. 15 is an assembled perspective view of the mated receptacle connector on the printed circuit board and the plug connector of the instant invention.
Figure 16A:
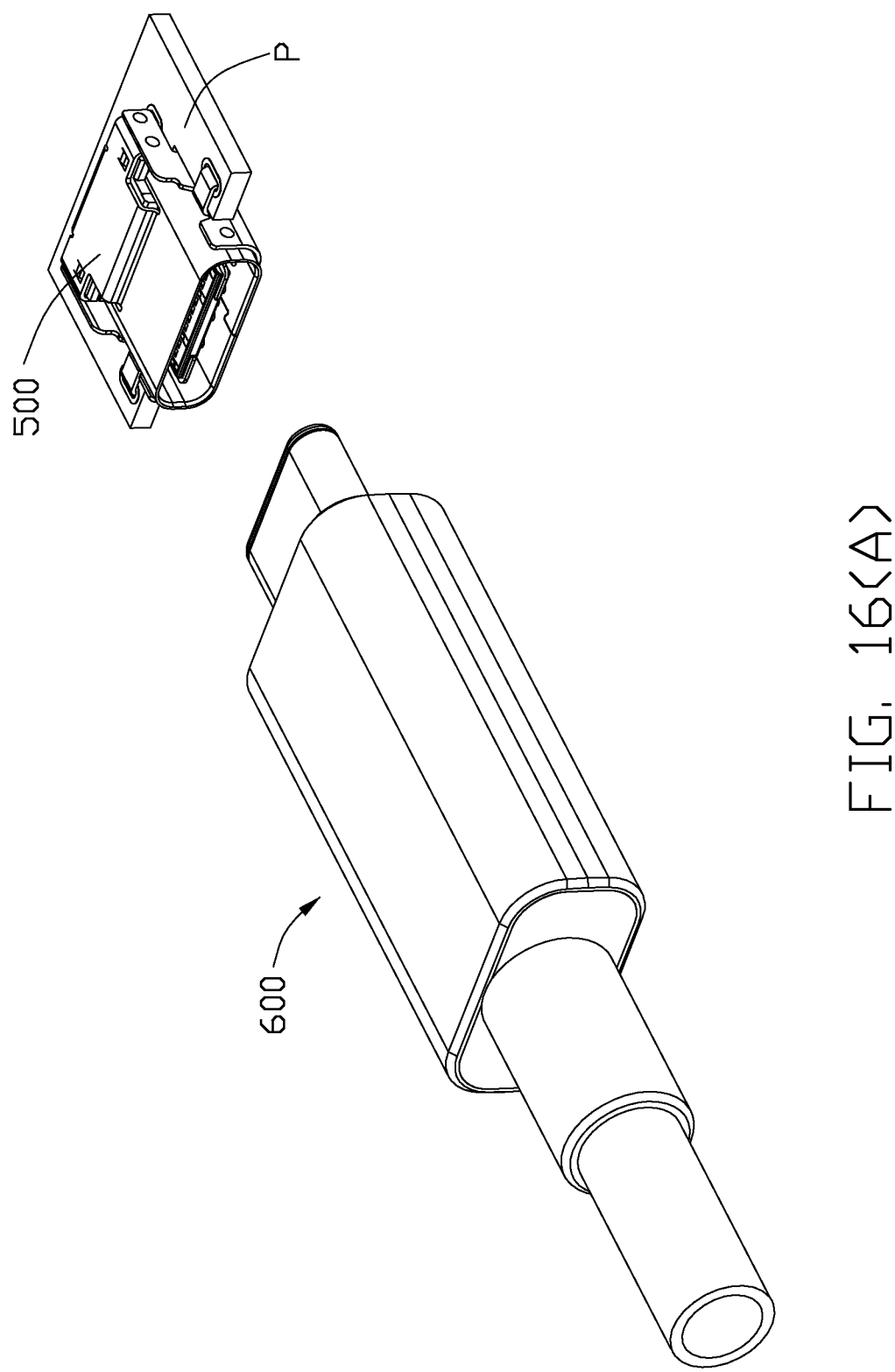
FIG. 16(A) is a front exploded perspective view of the receptacle connector and the plug connector of FIG. 15.
Figure 16B:
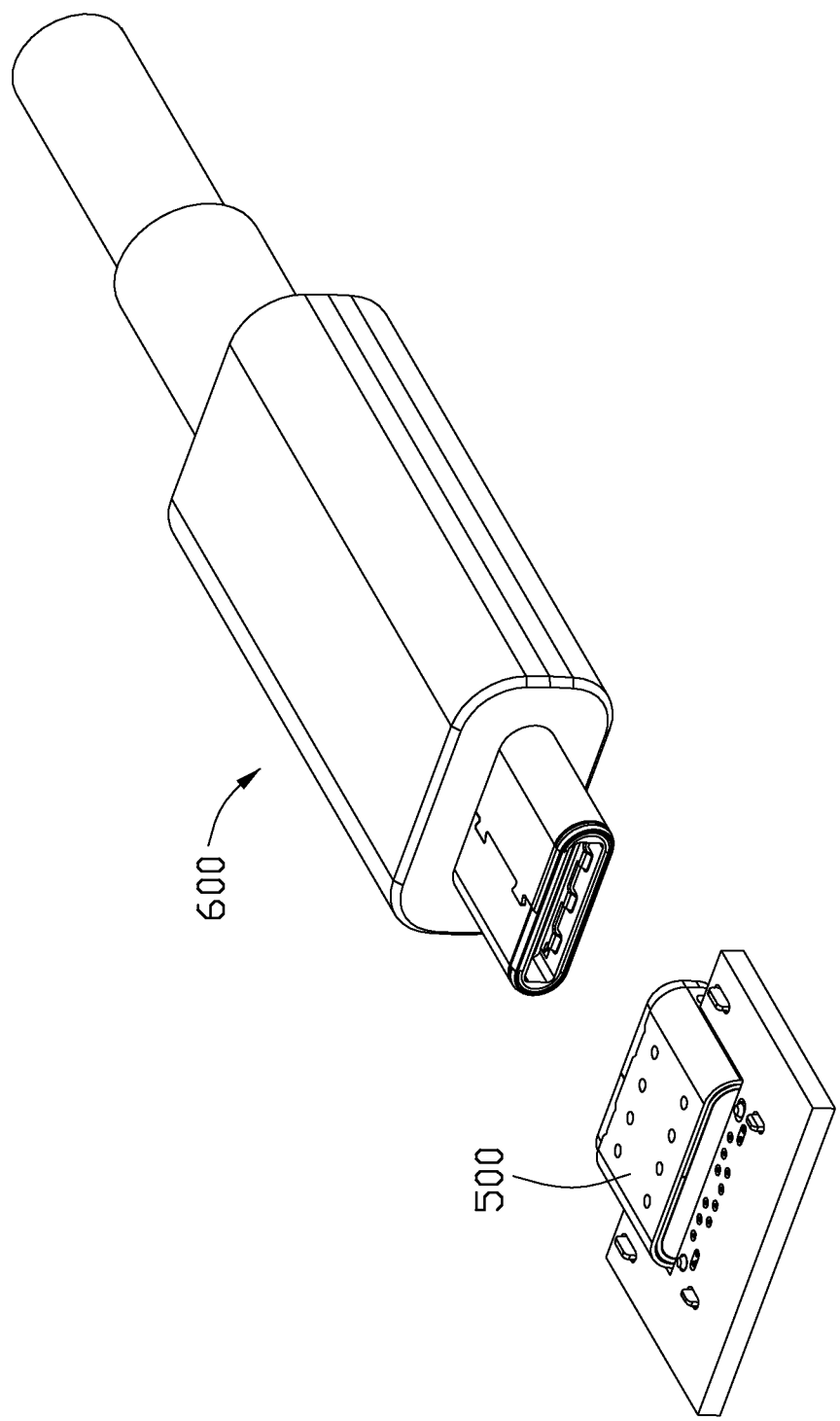
FIG. 16(B) is a rear exploded perspective view of the receptacle connector and the plug connector of FIG. 15.
Figure 17:
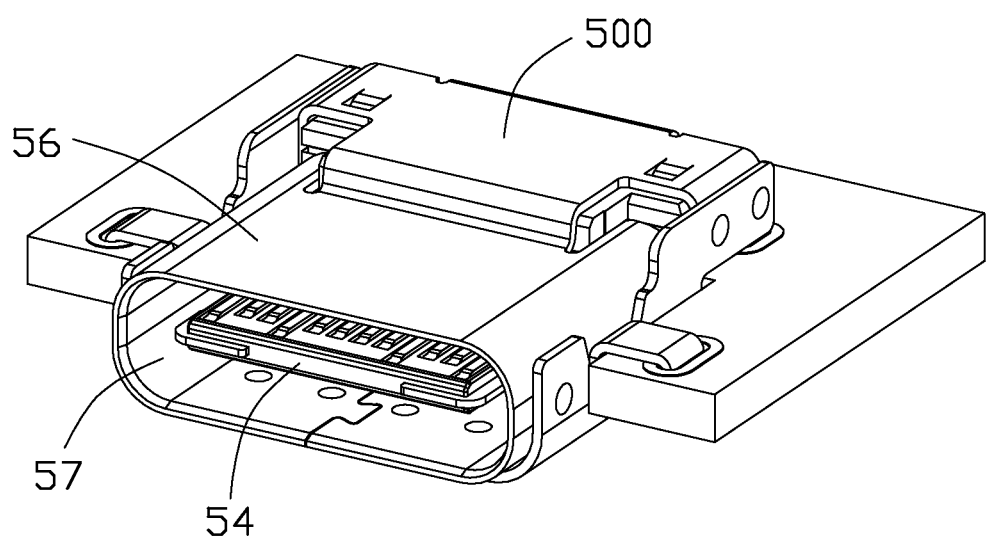
FIG. 17 is a front perspective view of the receptacle connector on the printed circuit board of FIG. 15.
Figure 18:
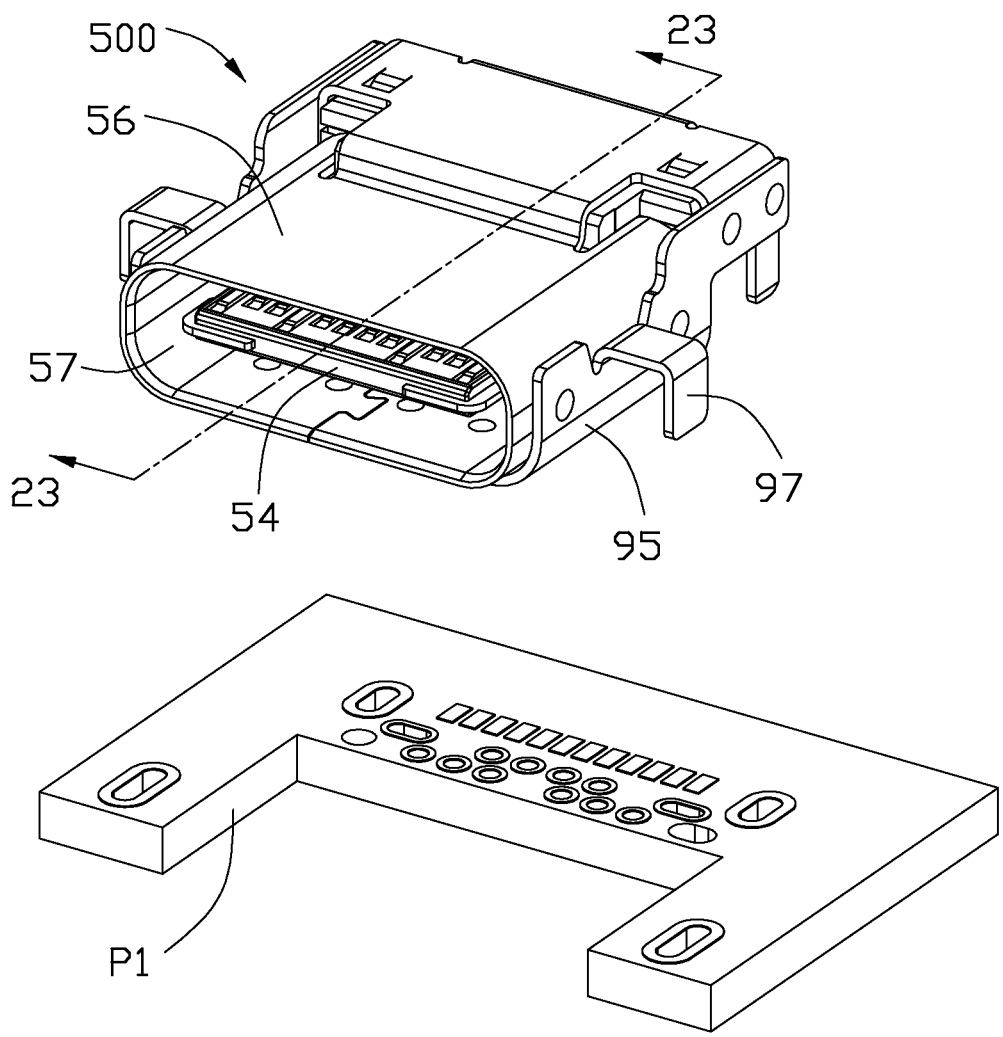
FIG. 18 is a front perspective view of the receptacle connector spaced from the printed circuit board of FIG. 15.
Figure 19A:
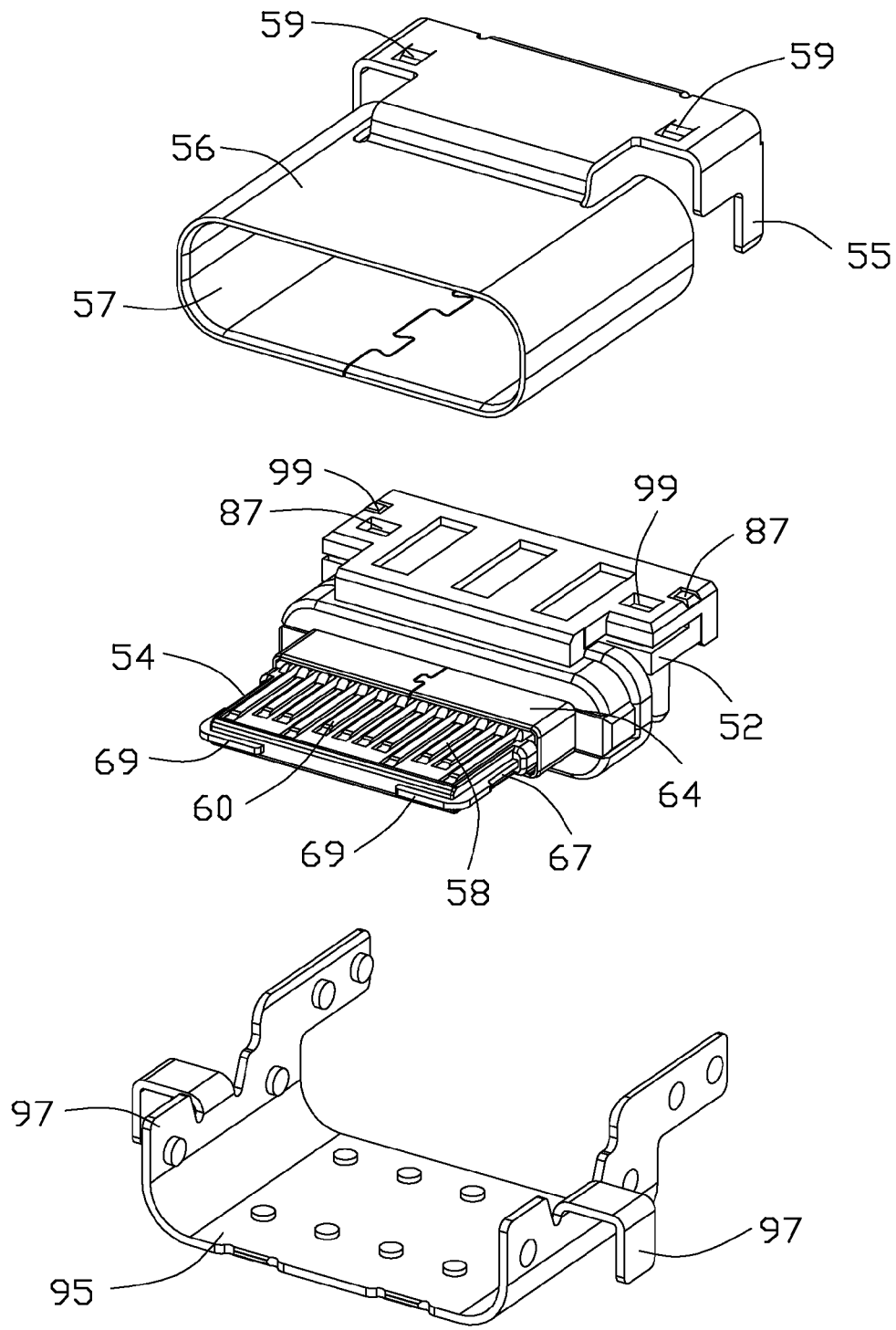
FIG. 19(A) is a front partially exploded perspective view of the receptacle connector of FIG. 15.
Figure 19B:
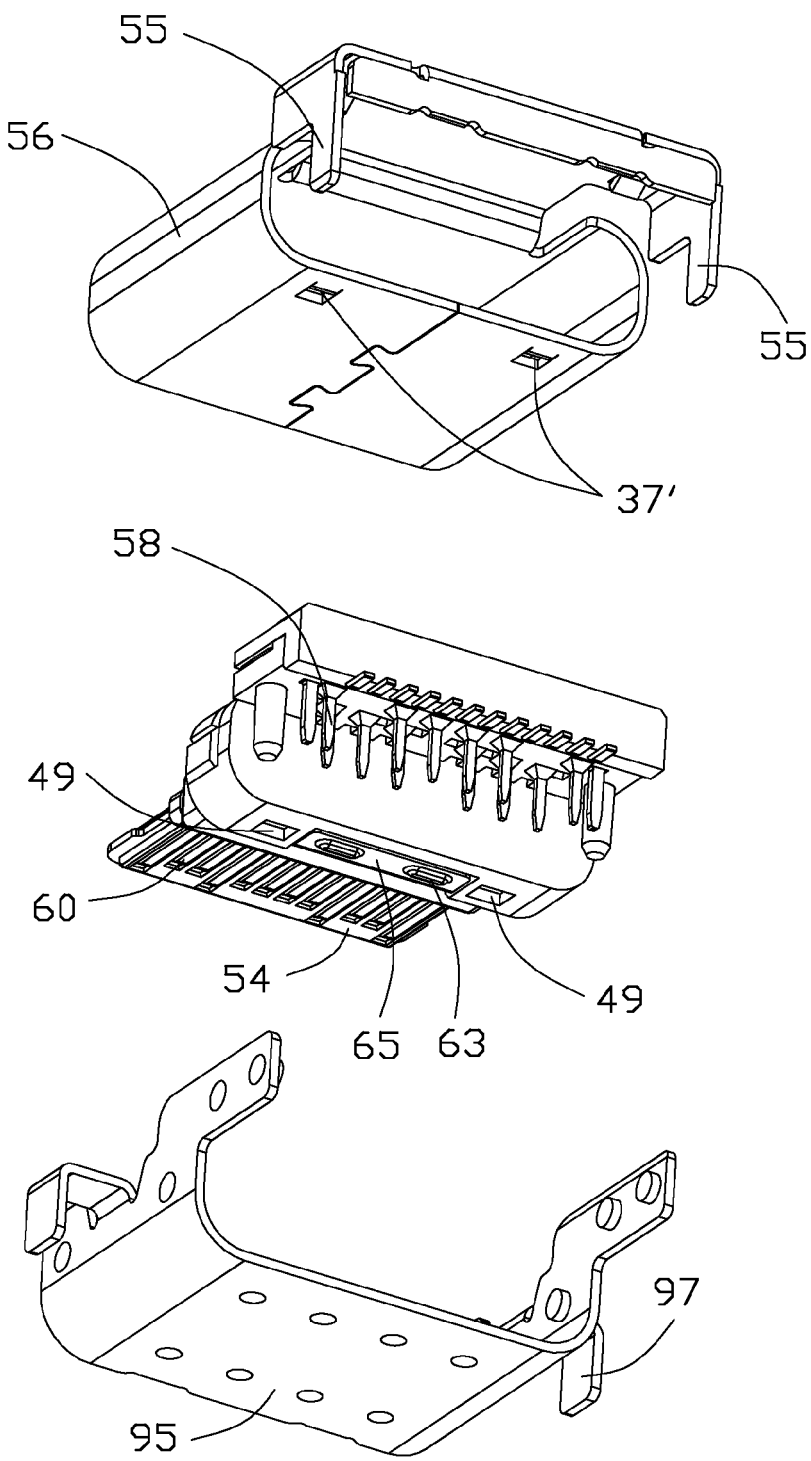
FIG. 19(B) is a rear partially exploded perspective view of the receptacle connector of FIG. 15.
Figure 20:
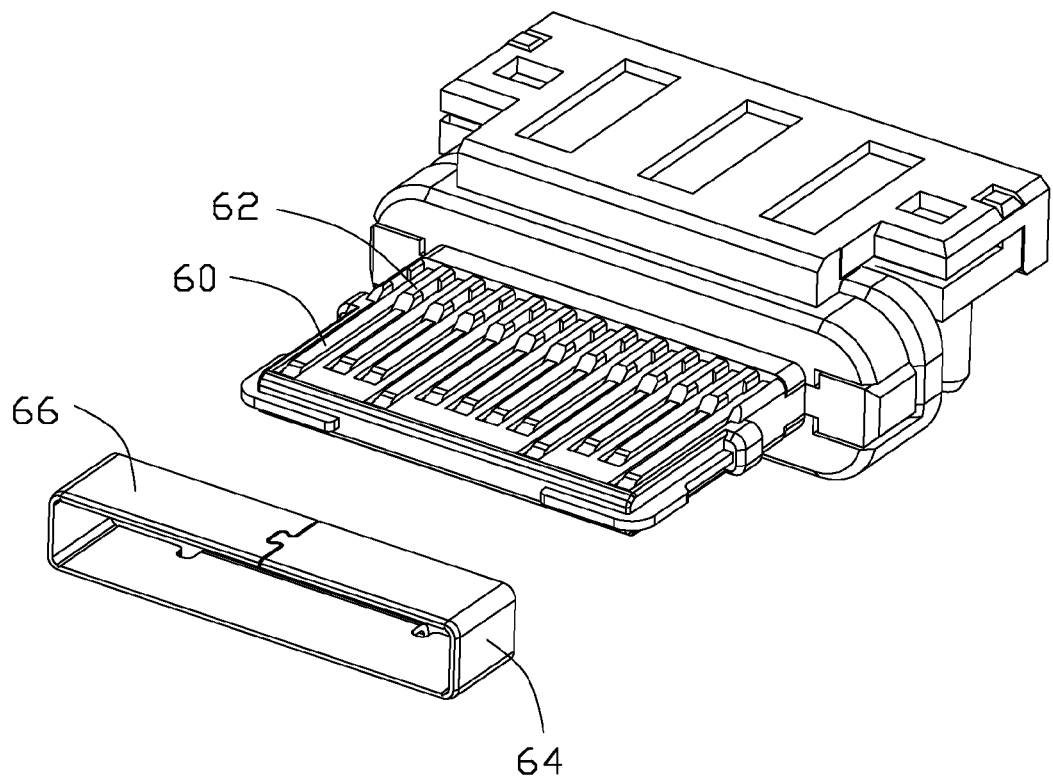
FIG. 20 is a front partially exploded perspective view of the receptacle connector of FIG. 15 without the shield thereof.
Figure 21A:
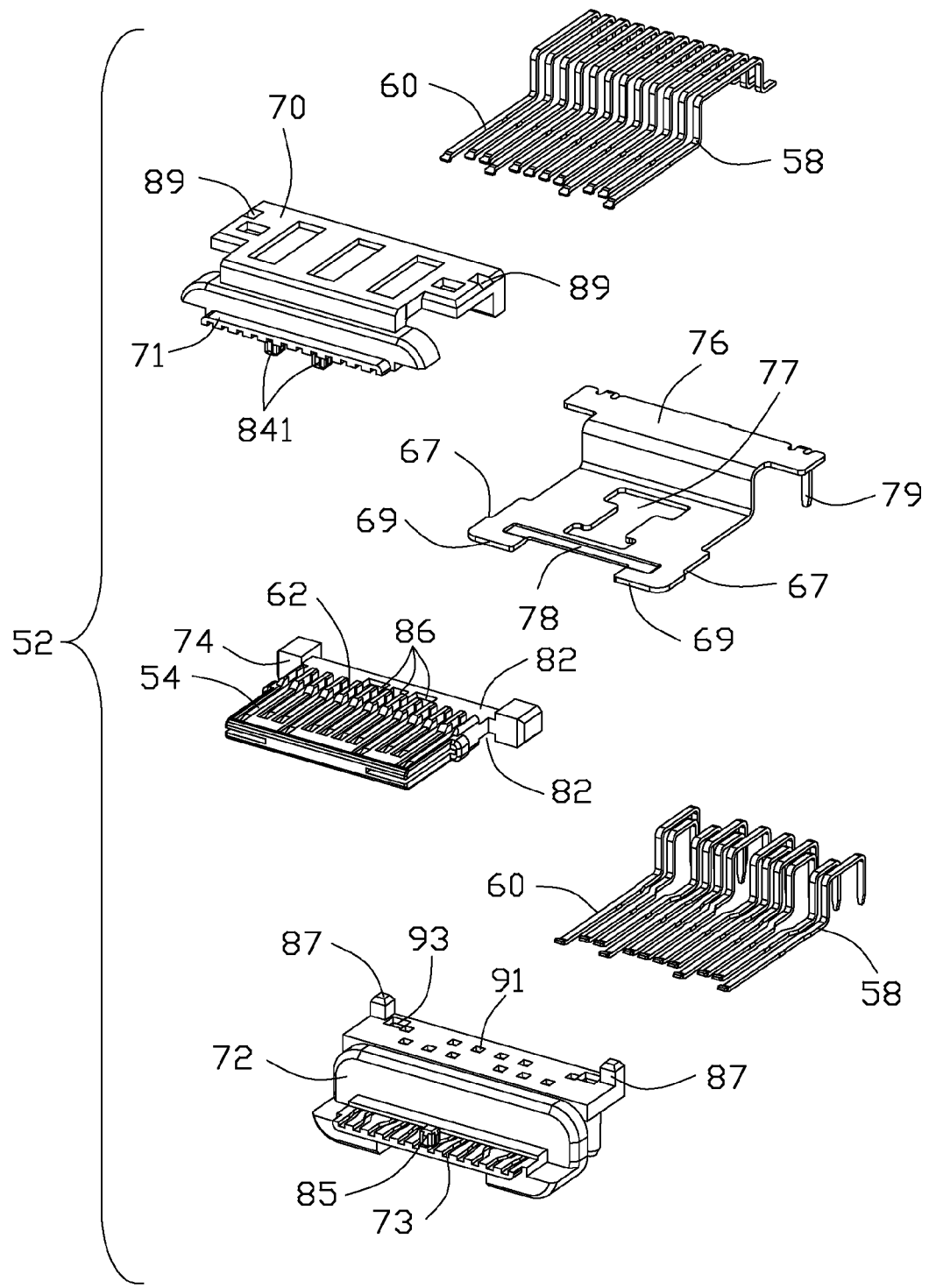
FIG. 21(A) is a front partially exploded perspective view of the receptacle connector of FIG. 15 to show the housing and the contacts thereof.
Figure 21B:
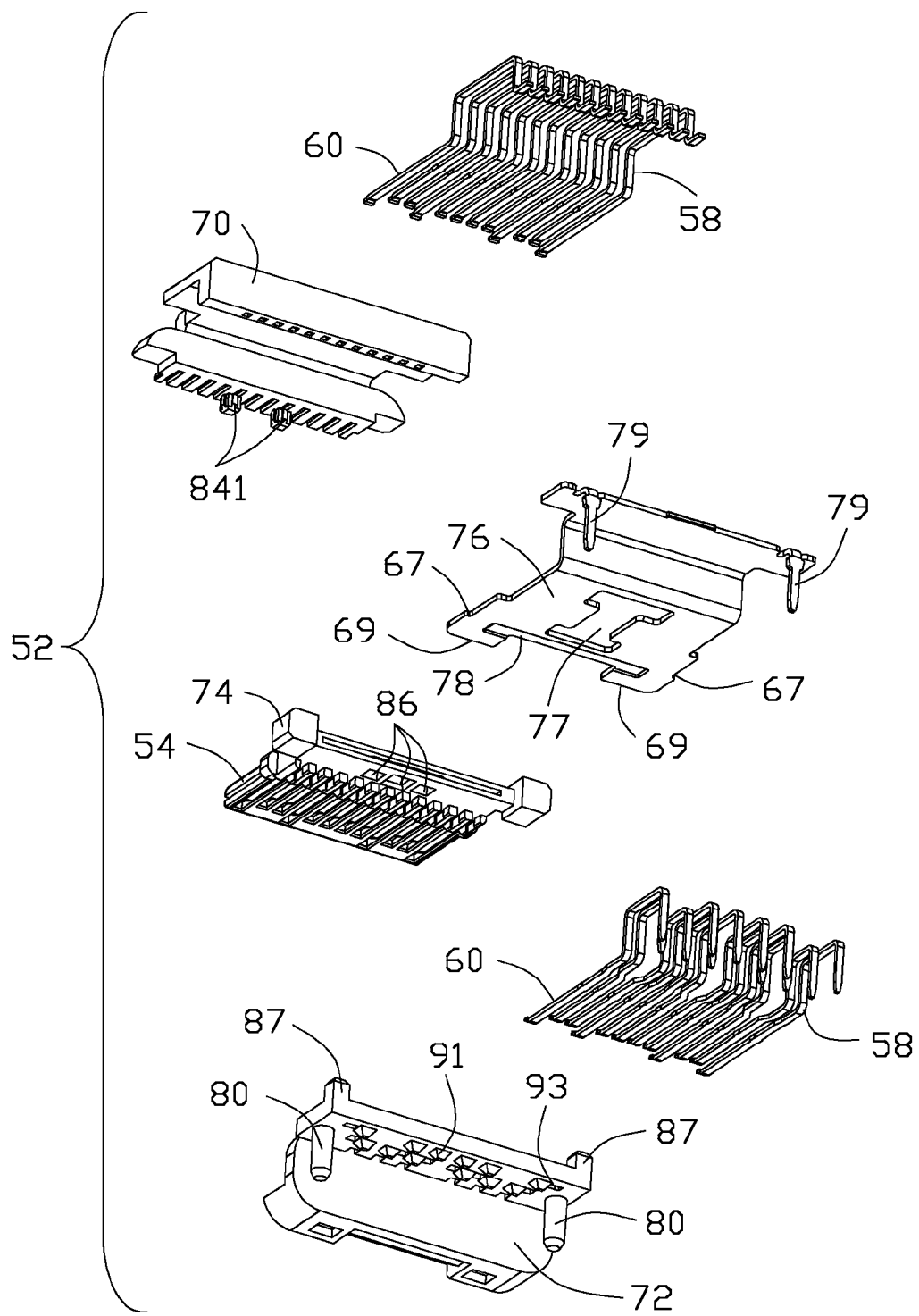
FIG. 21(B) is a rear partially exploded perspective view of the receptacle connector of FIG. 1 to show the housing and the contacts thereof.
Figure 22A:
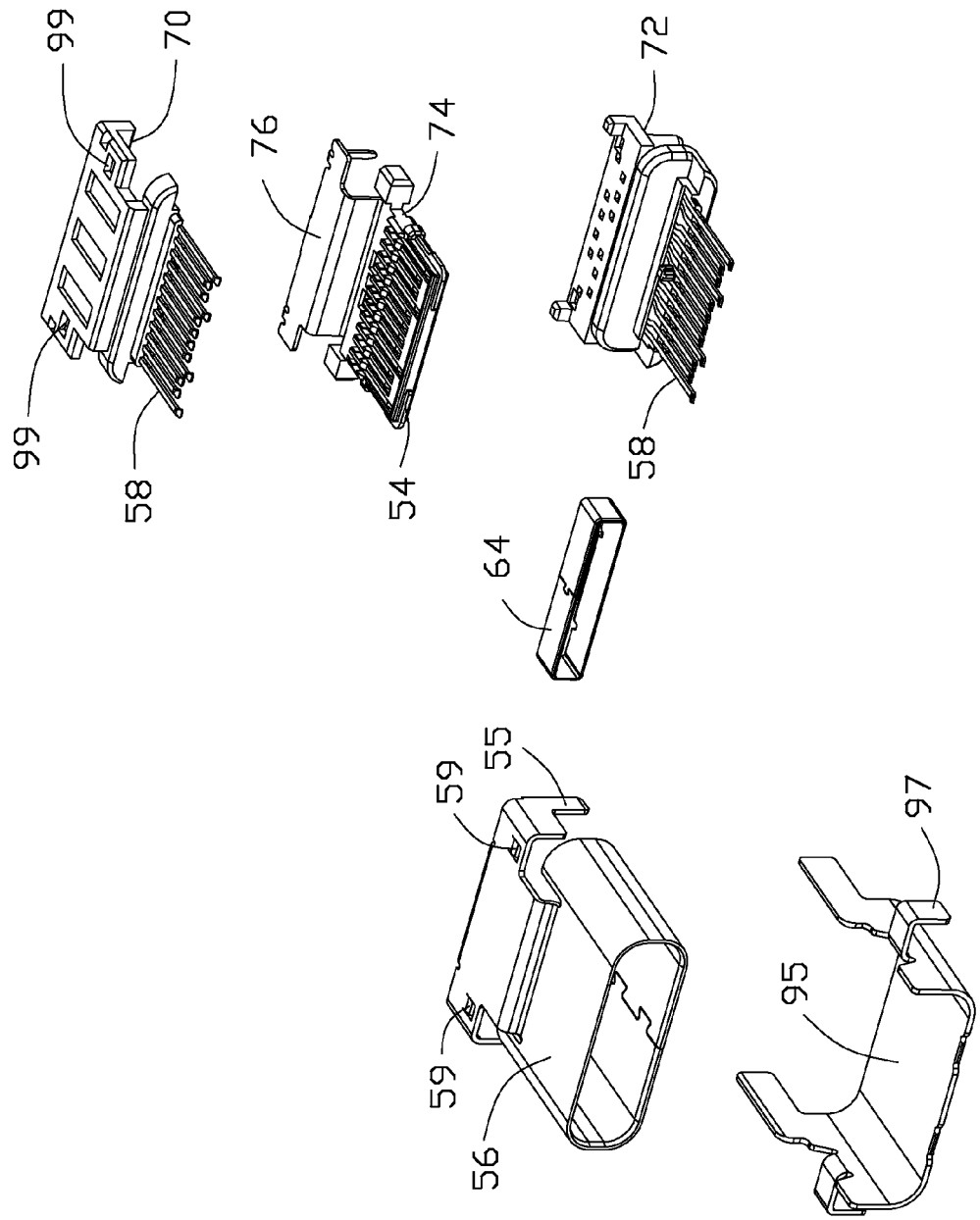
FIG. 22(A) is a front partially exploded perspective view of the receptacle connector of FIG. 15 wherein the housing and the contacts are pre-assembled together.
Figure 23:
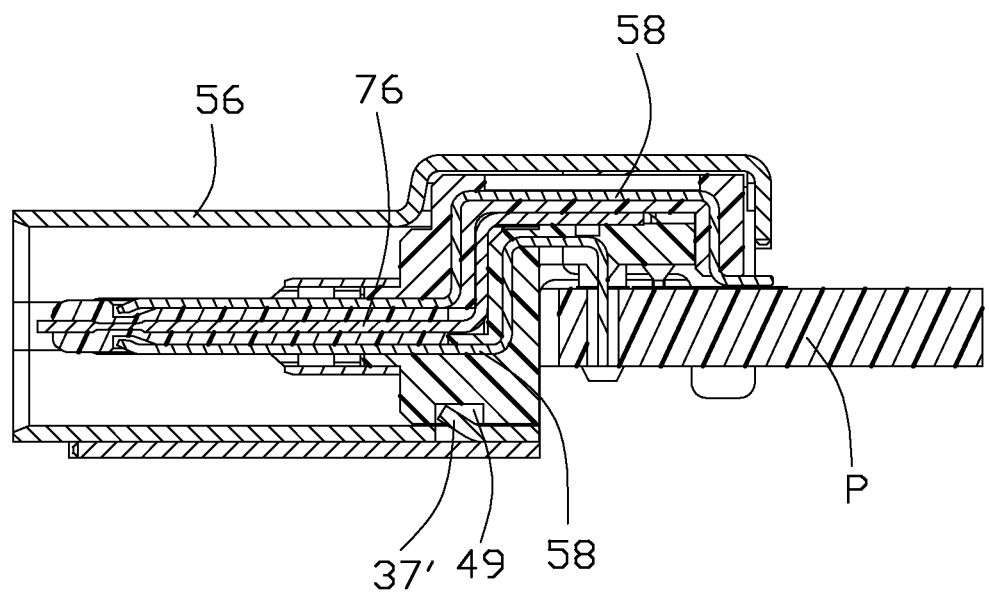
FIG. 23 is a cross-sectional view of the receptacle connector on the printed circuit board of FIG. 15 to show the retention tang of the shield.
Figure 24:
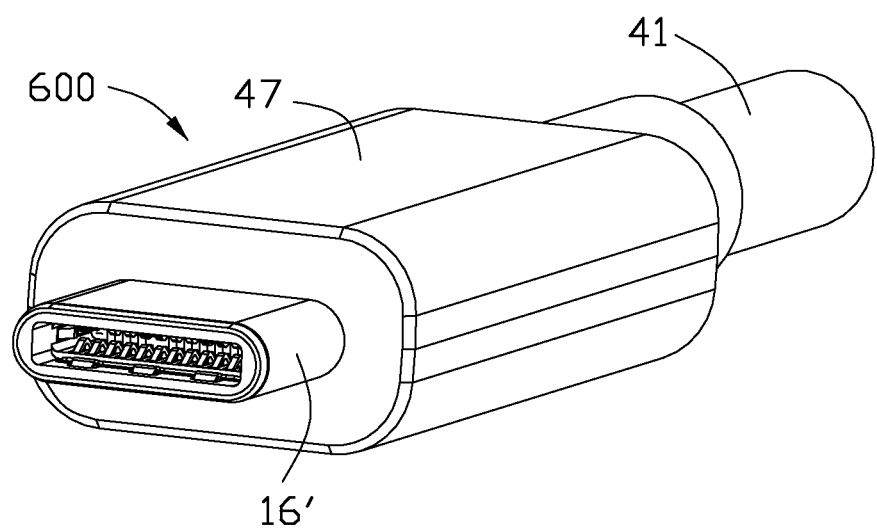
FIG. 24 is a front assembled perspective view of the plug connector of FIG. 15.
Figure 25A:
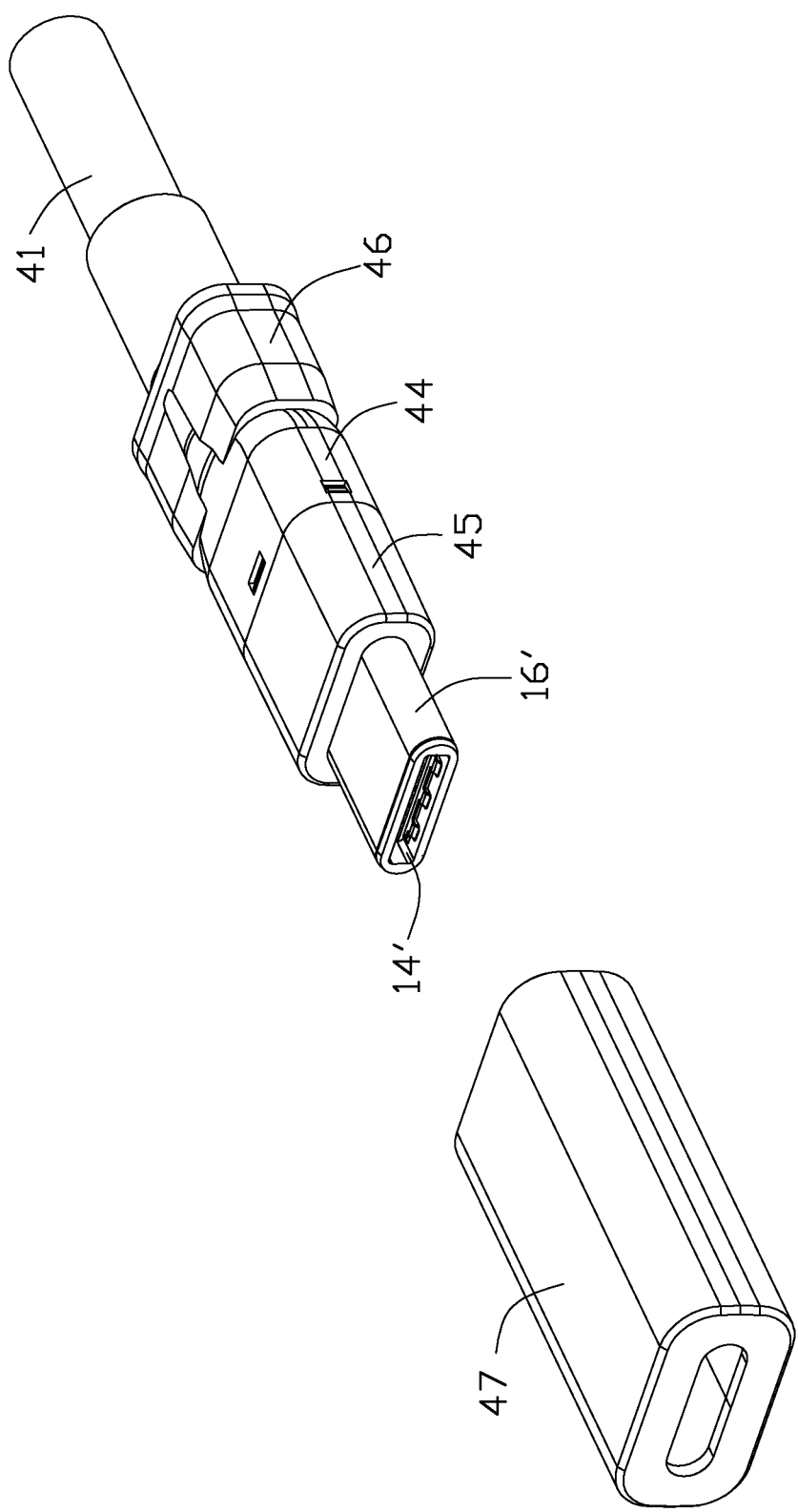
FIG. 25(A) is a front partially exploded perspective view of the plug connector of FIG. 15 wherein the cover is removed away from the remainder.
Figure 25B:
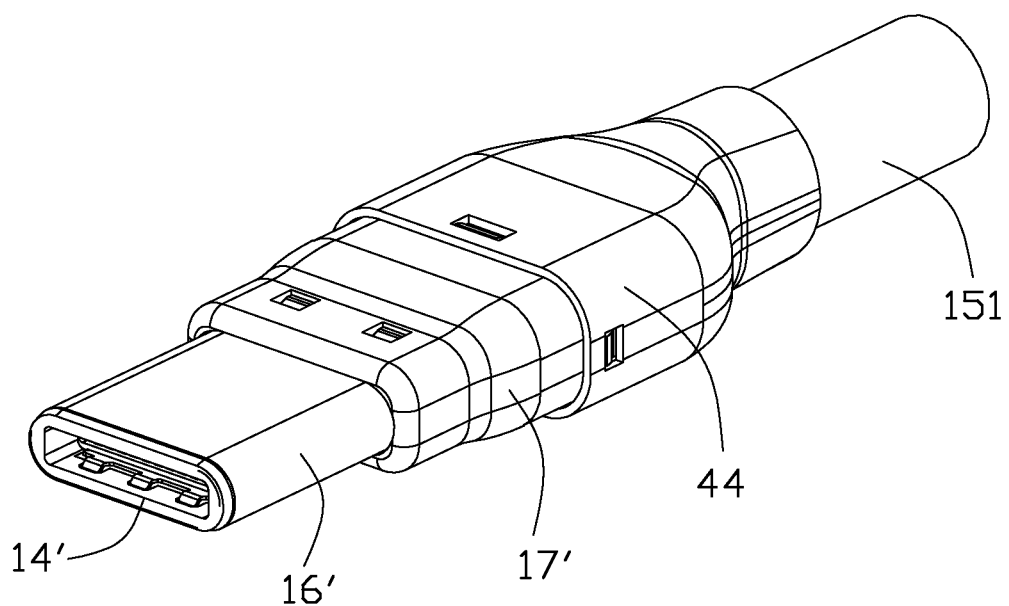
FIG. 25(B) is a front partially exploded perspective view of the plug connector of FIG. 25(A) wherein the front and rear over-moldings have been further removed.
Figure 26A:
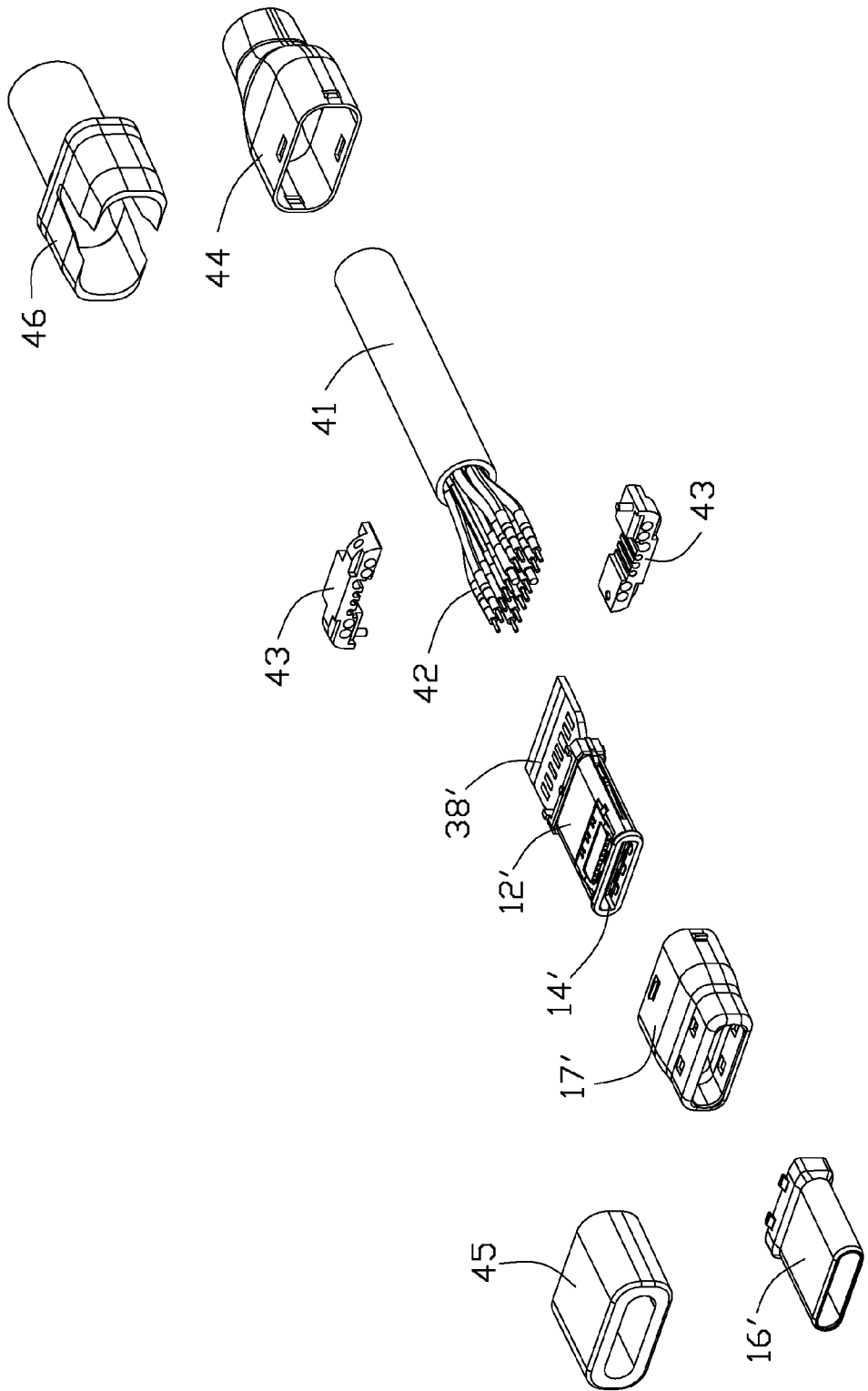
FIG. 26(A) is a front partially exploded perspective view of the plug connector of FIG. 15 without the cover thereof.
Figure 26B:
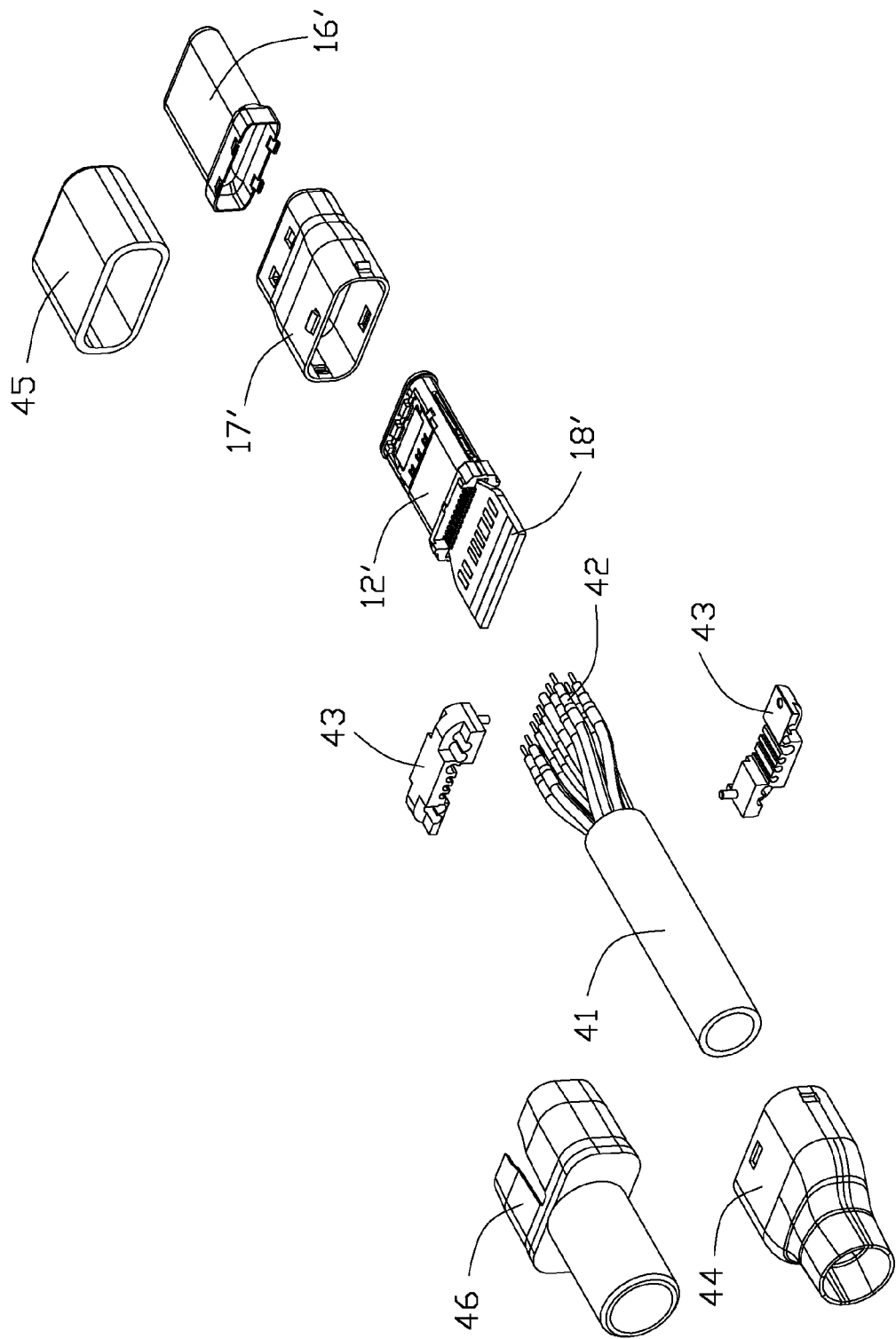
FIG. 26(B) is a rear partially exploded perspective view of the plug connector of FIG. 26(A).
Figure 27A:
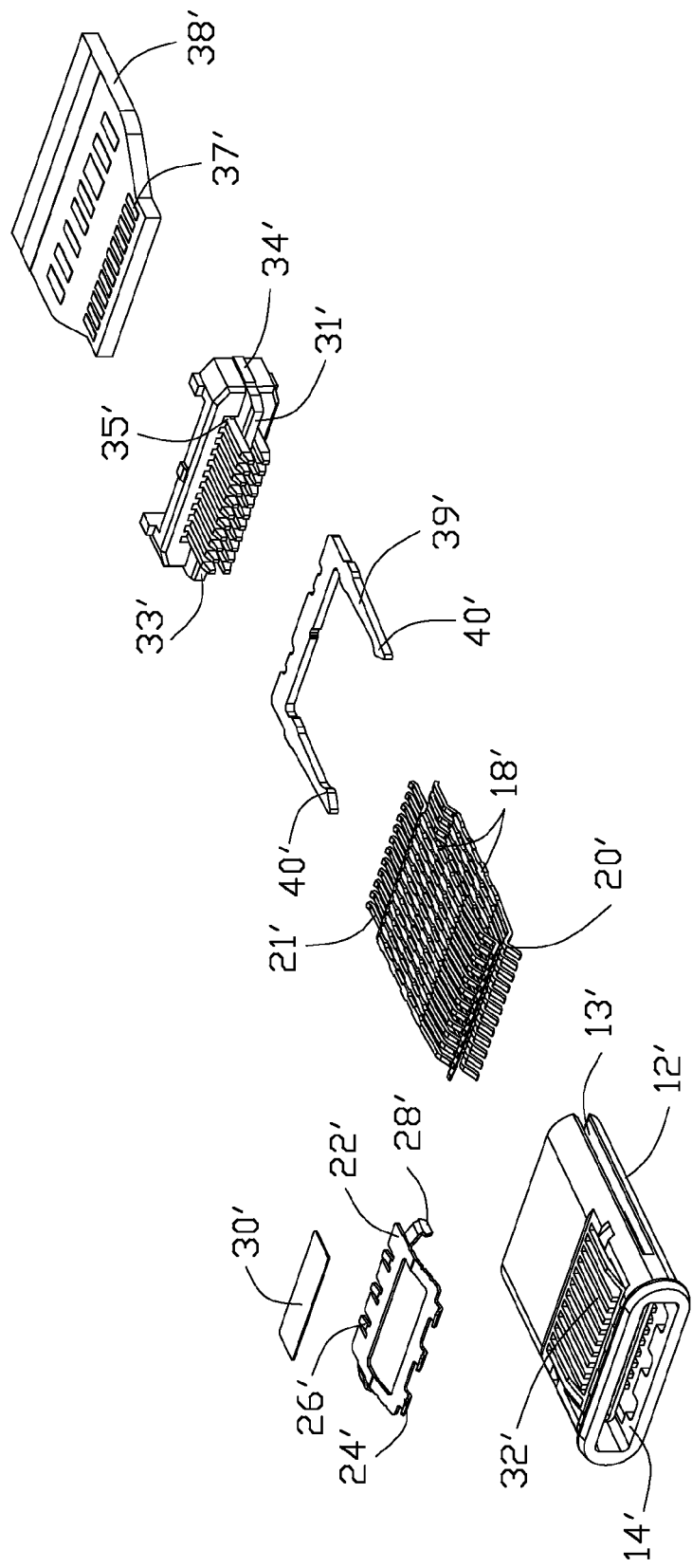
FIG. 27(A) is a front partially exploded perspective view of the plug connector of FIG. 26(A) by removal of additional parts therefrom.
Figure 27B:
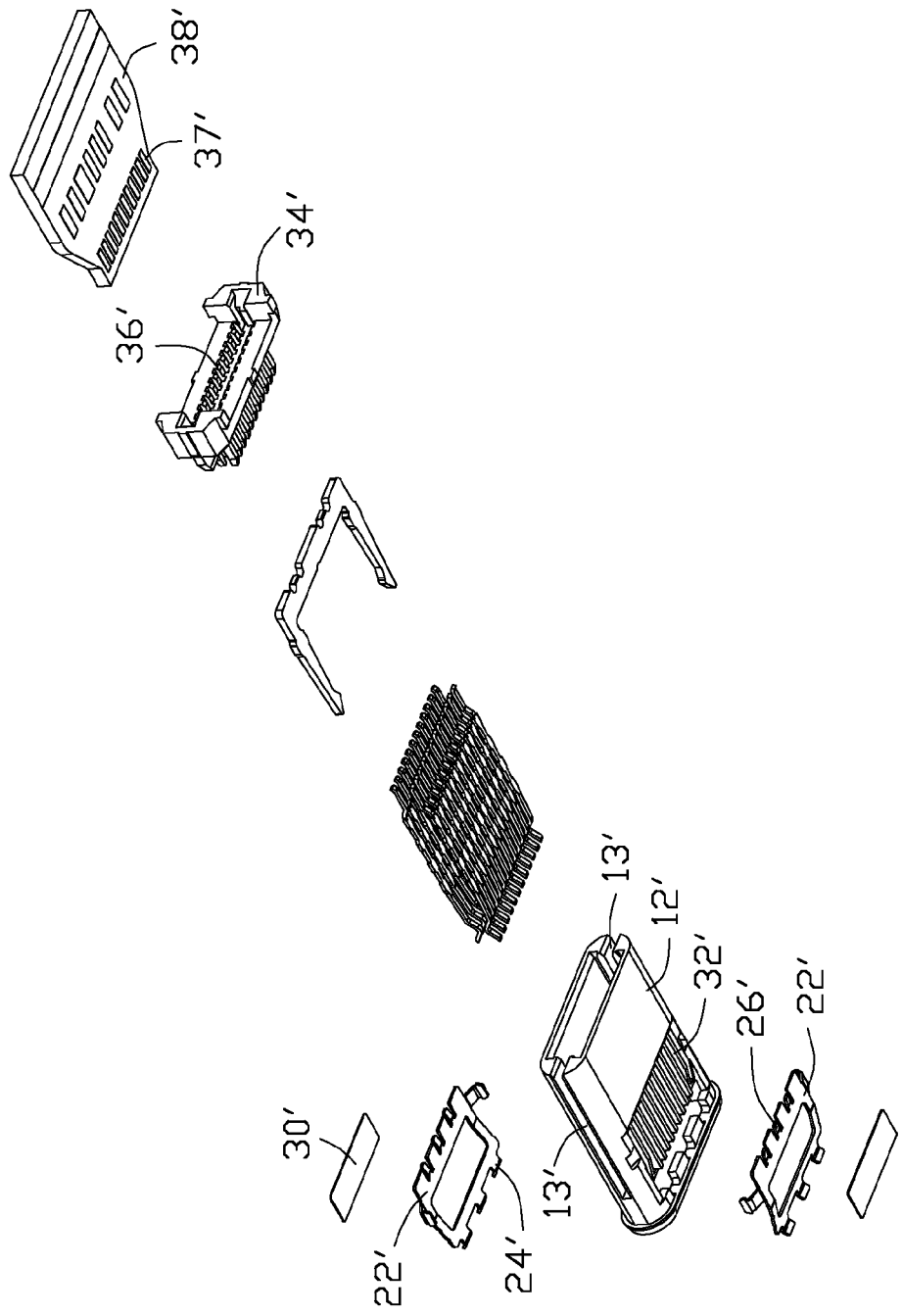
FIG. 27(B) is a rear partially exploded perspective view of the plug connector of FIG. 27(A).
Figure 28:
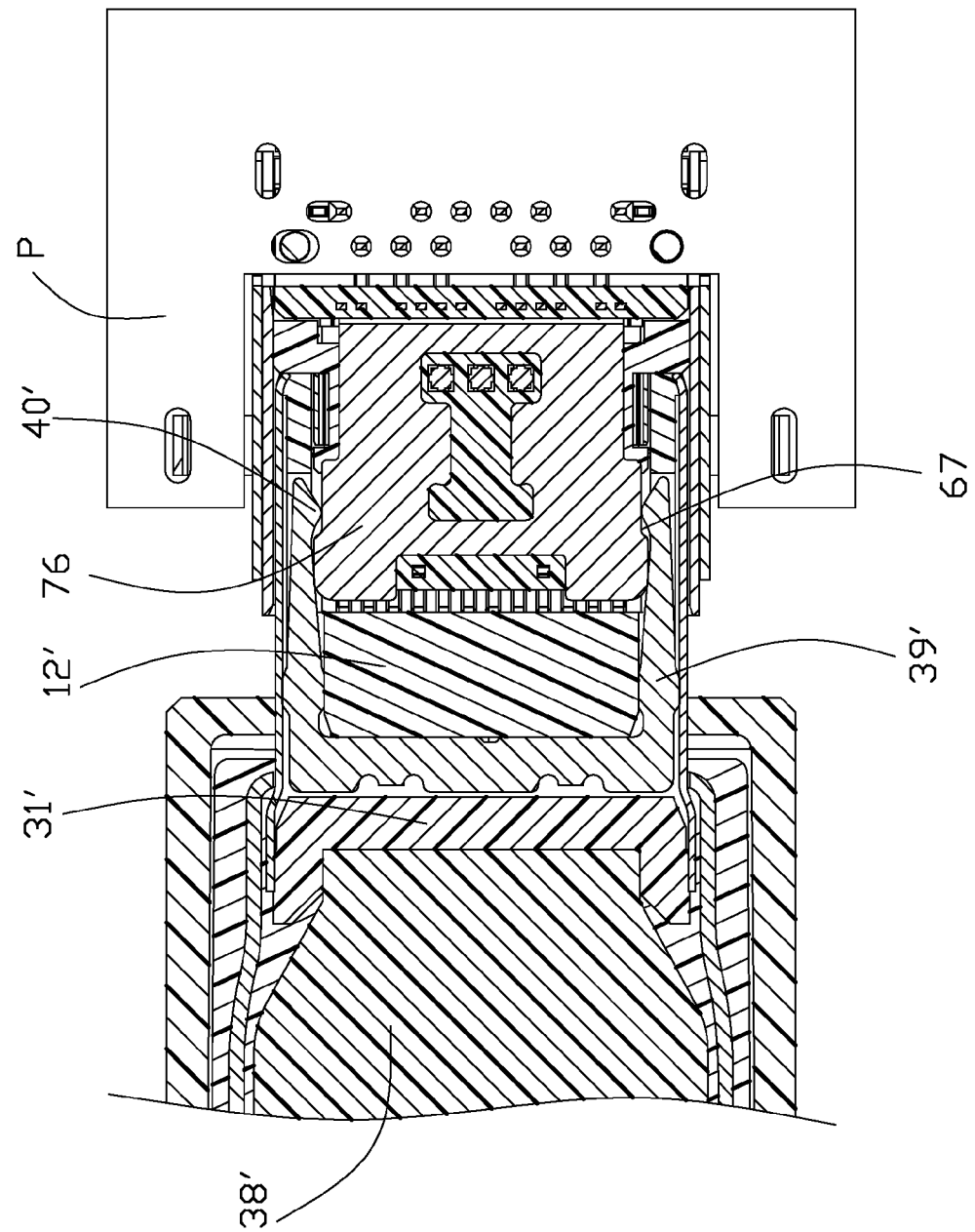
FIG. 28 is a cross-sectional view of the mated plug connector and receptacle connector of FIG. 15 to show how the latch of the plug connector is lockable engaged with the shielding plate of the receptacle connector.

FIGS. 13 and 14 are essentially FIGS. 6 and 7 of the parent application Ser. No. 14/337,180 similar to what is shown in FIG. 6, to show the U-shaped metallic plate 502 between the top insulator (not shown) with the upper conductors 501 and the bottom insulator 504 with the lower conductors 503 has the corresponding notch sections 505 exposed outside of the lateral side edges of the top insulator and the bottom insulator 504 for easy mechanical retention and electrical connection FIGS. 15-16(B) show a plug connector 600 mated with a receptacle connector 500 mounted in a notch P1 of a printed circuit board P. Referring to FIGS. 17-23, the receptacle connector 500 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 600 thereinto. A step structure 62 is formed around a root of the mating tongue 54. A one piece metallic EMI collar 64 includes a loop structure 66 intimately surrounding the step structure 62.

The housing 52 is composed of the upper piece 70 and a lower piece 72 commonly sandwiching therebetween a middle piece 74 which forms the mating tongue 54. The upper row contacts 58 are associated with the upper piece 70, the lower row contacts 58 associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. The lower piece 72 includes a pair of mounting posts 80 for mounting the housing 52 to the printed circuit board P.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismating consideration, and a pair of lateral edge sections 67 as well extending beyond the side edge of the mating tongue 54 and further equipped with latching structures for locking with a latch 39 of the plug connector 600 (illustrated later). In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted to the printed circuit board P for supporting the receptacle connector 500 within the notch 102 of the printed circuit board P. The shield 56 further includes a pair of mounting legs 55 for mounting to the printed circuit board P and a pair of locking tabs 59 received in the recesses 99 of the upper piece 70 after the shield 56 is rearwardly assembled to the housing 52 in a front-to-back direction.

Referring to FIGS. 10-13(B) and further FIG. 14, the plug connector 600 includes an insulative housing 12' having a capsular front contour with a rectangular receiving cavity 14' therein and enclosed in a metallic shell 16. Opposite upper and lower rows of contacts 18 are disposed in the corresponding passageways 32' of the housing with corresponding contacting sections 20' extending into the receiving cavity 14'. A pair of upper and lower EMI (Electro-Magnetic Interference) spring plates 22' are enclosed in the shell 16, and each of the EMI spring plates 22' is sandwiched between the shell 16' and the housing 12' and includes a front resilient region 24' extending inwardly toward the receiving cavity 14' and in front of the contacting sections 20', a rear abutting region 26' to abut against the shell 16', and a pair of side retention regions 28' retainably engaged within corresponding side portions of the housing 12'. A pair of tapes 30' are disposed upon two opposite sides of the housing 12' so as to isolate the contacting section 20' from the shell 16'. A spacer 34' is located behind the housing and defines a plurality of passages 35' through which the tail sections 21' of the contacts 18' rearwardly extend. A recessed region 36' is formed in a rear face of the spacer 34' to receive a front edge region of a paddle card 38' wherein the tail sections 21' of the contacts 18' extending through the corresponding passages 35', are soldered upon the corresponding pads 37'. The spacer 34' forms a forward extending blade 31' with a pair of forward protrusions 33' on two faces in the vertical direction to be commonly inserted into a back side of the housing 12' wherein the blade 31' is essentially received in the side slots 13' of the housing 12'. A U-shaped metallic latch 39' received in the side slots 13' of the housing 12' with a pair of locking heads 40' extending into the two opposite lateral sides of the receiving cavity 14' to lock with the lateral edge sections 67 of the shielding plate 76 of the receptacle connector 50' during mating. Understandably, the latch 39' is restrained by the blade 31', the forward protrusions 33', the slots 13' and an interior rear face of the housing 12'.

A cable 41 behind the paddle card 38', encloses a plurality of wires 41 regulated by a pair of organizer 42 to be soldered upon a rear region of the paddle card 38'. An auxiliary rear shell 17' grasps the shell 16' to shield the paddle card 38', and a clipper 44 grasps the cable 41 behind the paddle card 38'. Opposite front overcoat 45 and rear overcoat 46 are overmolded upon the rear shell 17' and the clipper 44, respectively. Finally, a cover 47 essentially fully covers the clipper 44, the front overcoat 45 and the rear overcoat 46. During mating, the mating tongue 54 is received in the receiving cavity 14' with the corresponding contacting sections 60 of the contacts 58 of the receptacle connector 500 connected to the contacting sections 20' of the contacts 18' of the plug connector 600 wherein the latch 39' is locked with the shielding plate 76, and the front resilient region 24' of the spring plate 22' contacts the collar 64.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What a claimed is:

1. An electrical connector assembly comprising:
a plug connector defining an external mating tongue with two opposite first and second surfaces thereon;
a plurality of first conductors formed on the first surface; a plurality of second conductors formed on the second surface; both said first conductor and said second conductor categorized with at least power pads, differential pads and grounding pads; wherein the mating tongue defines a pair of notches with corresponding conductor portions therein for both electrical connection and mechanical retention;
a receptacle connector defining an insulative housing with a receiving cavity therein, wherein two rows of contacts are disposed respectively upon an upper interior surface and a bottom interior surface, and a pair of power contacts are respectively located on two opposite lateral side interior surfaces for coupling to the corresponding conductor portions in the corresponding notches;
wherein the mating tongue defines a pair of raised ribs formed on two opposite side region of each of the opposite surface thereof, wherein a first vertical dimension is defined between the opposite surface on an area with the pair of ribs thereon, and a second vertical dimension is defined on another area without the pair of ribs thereon, said second vertical dimension being smaller than the first vertical dimension; and the receptacle connector defines a pair of slots formed in the housing beside each of the opposite upper and bottom sides and adjacent to two opposite lateral sides thereof, wherein during mating, the mating tongue is received in the receiving cavity and the raised ribs are received in the corresponding slots with the contacts coupled to the corresponding conductors, respectively;
a different type receptacle connector defining another receiving cavity with a transverse direction larger that that of the mating tongue, and a third vertical dimension between the first vertical dimension and the second dimension, so that the pair of ribs prevent the mating tongue from being inserted into said another cavity.

2. The electrical connector assembly as claimed in claim 1, wherein the mating tongue comprises a first insulator with the plurality of first conductor, a second insulator with the plurality of second conductors and an internal printed circuit board snugly sandwiched between the first insulator and the second insulator.

3. The electrical connector assembly as claimed in claim 1, wherein a pair of wedged structures are formed on two opposite lateral sides of the mating tongue around a front end for guidable insertion of the ribs into the corresponding slots.

4. The electrical connector assembly as claimed in claim 1, wherein the conductor portions in the notches are of power transmission.

5. The electrical connector assembly as claimed in claim 4, wherein said conductor portions are formed on two opposite sides of a single U-shaped metallic plate.

6. The electrical connector assembly as claimed in claim 5, wherein said metallic plate surrounds an internal printed circuit board which is sandwiched between a first insulator to which the first conductors are attached, and a second insulator to which the second conductors are attached.

7. An electrical connector assembly comprising:
a first connector including:
a first insulative housing defining therein a cavity forwardly communicating with an exterior along a front-to-back direction;
upper and lower rows of first contacts disposed in the first housing along a transverse direction perpendicular to said front-to-back direction and respectively located by opposite upper and lower sides of the cavity in a vertical direction perpendicular to both said front-to-back direction, each of said contacts extending along the front-to-back direction;
a pair of large deflectable contacts disposed in the first housing by two opposite lateral sides of the cavity in said transverse direction;
a second connector matable with the first connector and including:
a second insulative housing defining a mating tongue with opposite upper and lower surfaces thereon; opposite upper and lower rows of second contacts disposed in the second housing and exposed upon the upper and lower surfaces, respectively;
a pair of conductor portions formed on two opposite lateral sides of the mating tongue; wherein each of the conductor portions defines a latching structure so as to latch the corresponding large deflectable contact when the mating tongue is received in the cavity during mating;
said conductor portions are unitarily formed on two lateral sides of a U-shaped metallic plate; wherein
said U-shaped metallic plate transmit power and surrounds an internal printed circuit board on which the second contacts and a cable are mechanically and electrically connected.

8. The electrical connector assembly as claimed in claim 7, wherein said latching structure is located around a notch in the mating tongue.

9. The electrical connector assembly as claimed in claim 7, wherein the first connector is mounted upon a printed circuit board while the second connector is connected to a cable.

10. The electrical connector assembly as claimed in claim 7, wherein the first housing defines guiding slots communicating with the cavity, and the second housing defines a raised ribs received in the slots, respectively.

11. The electrical connector assembly as claimed in claim 7, wherein the mating tongue defines a wedged structure at a front edge region.

12. The electrical connector assembly as claimed in claim 7, wherein each of said large deflectable contacts forms a bulged contour to couple to the latching structure of the corresponding conductor portions for mechanical retention therebetween.

13. An electrical connector comprising:
an upper terminal module including a plurality of upper contacts embedded within an upper insulator with corresponding contacting sections upwardly exposed to an exterior;
a lower terminal module including a plurality of lower contacts embedded within a lower insulator with corresponding contacting sections downwardly exposed to the exterior;
a metallic reinforcement plate sandwiched between the upper terminal module and the lower terminal module; wherein
the upper terminal module, the lower terminal module and the reinforcement plate commonly form a mating tongue, and the metallic reinforcement plate forms a pair of latching sections on two opposite lateral sides exposed outside of the mating tongue for respectively latching with a pair of deflectable retention pieces when said mating tongue is received within a cavity of a complementary connector;
said mating tongue forms a pair of notches in two opposite lateral sides with the pair of latching sections exposed therein, respectively.

14. The electrical connector as claimed in claim 13, wherein the upper contacts and the lower contacts are connected to corresponding wires, respectively.

* * * * *